United States Patent
Lee et al.

(10) Patent No.: US 11,643,737 B2
(45) Date of Patent: May 9, 2023

(54) PHOTOCATHODE STRUCTURE, METHOD OF FABRICATING THE SAME, AND HYBRID ELECTRIC GENERATING ELEMENT INCLUDING THE SAME

(71) Applicant: INDUSTRY-UNIVERSITY COOPERATION FOUNDATION HANYANG UNIVERSITY ERICA CAMPUS, Ansan-si (KR)

(72) Inventors: Jung-Ho Lee, Ansan-si (KR); Jin-Young Jung, Ansan-si (KR); Dong-Hyung Kim, Ansan-si (KR); Sung-Hae Kim, Ansan-si (KR)

(73) Assignee: INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 0 days.

(21) Appl. No.: 17/346,325

(22) Filed: Jun. 14, 2021

(65) Prior Publication Data
US 2021/0395909 A1    Dec. 23, 2021

(30) Foreign Application Priority Data
Jun. 23, 2020    (KR) .......................... 10-2020-0076732

(51) Int. Cl.
*C25B 9/50*    (2021.01)
*C25B 1/04*    (2021.01)
(Continued)

(52) U.S. Cl.
CPC ............ *C25B 9/50* (2021.01); *C23C 16/0272* (2013.01); *C23C 16/405* (2013.01);
(Continued)

(58) Field of Classification Search
None
See application file for complete search history.

(56) References Cited

U.S. PATENT DOCUMENTS 4,656,103 A * 4/1987 Reichman ................ H01G 9/20
204/266
9,196,772 B2    11/2015 Lienhart et al.
(Continued)

FOREIGN PATENT DOCUMENTS

| KR | 10-1523743 B1 | 5/2015 |
| KR | 10-1739823 B1 | 5/2017 |
| KR | 10-2019-0073895 A | 6/2019 |

OTHER PUBLICATIONS

Machine translation of Lee et al (KR 10-1523743) (Year: 2015).*
(Continued)

*Primary Examiner* — Harry D Wilkins, III
(74) *Attorney, Agent, or Firm* — Finch & Maloney PLLC

(57) ABSTRACT

Provided is a photocathode structure including: a photocathode including silicon (Si); an intermediate layer formed on the photocathode, and including a silicon oxide ($SiO_x$); and a protective layer foiled on the intermediate layer, and including a metal oxide, wherein the intermediate layer is a tunneling barrier configured to transfer charges from the photocathode to the protective layer by an electric field applied from an outside.

7 Claims, 21 Drawing Sheets

(51) Int. Cl.

| | |
|---|---|
| *C25B 9/65* | (2021.01) |
| *C25B 11/053* | (2021.01) |
| *C25B 11/091* | (2021.01) |
| *C25B 11/059* | (2021.01) |
| *C23C 16/455* | (2006.01) |
| *C23C 16/40* | (2006.01) |
| *C23C 16/02* | (2006.01) |
| *H10N 10/17* | (2023.01) |

(52) U.S. Cl.
CPC ......... *C23C 16/45555* (2013.01); *C25B 1/04* (2013.01); *C25B 9/65* (2021.01); *C25B 11/053* (2021.01); *C25B 11/059* (2021.01); *C25B 11/091* (2021.01); *H10N 10/17* (2023.02)

(56) References Cited

U.S. PATENT DOCUMENTS

2016/0108527 A1* 4/2016 Kudo ................. C25B 9/17
　　　　　　　　　　　　　　　　　　　　204/252
2017/0167035 A1    6/2017 Lee et al.

OTHER PUBLICATIONS

Zhang et al, Ultrathin HfO2 passivated silicon photocathodes for efficient alkaline water splitting, Applied Physics Letters, vol. 119, No. 19, Nov. 2021, pp. 193901-1 to 193901-6 (Year: 2021).*

Jung et al, Dynamic Photoelectrochemical Device Using an Electrolyte-Permeable NiOx/SiO2/Si Photocathode with an Open-Circuit Potential of 0.75 V, ACS Applied Material Interfaces, Volo. 10, No. 9, Feb. 2018, pp. 7955-7962 (Year: 2018).*

Xing et al, Enhanced PEC performance of nanoporous Si photoelectrodes by covering HfO2 and TiO2 passivation layers, Scientific Reports, vol. 7, Article 43901, Mar. 2017, pp. 1-10 (Year: 2017).*

Cheng et al, Surface Passivation Properties of HfO2 Thin Film on n-Type Crystalline Si, IEEE Journal of Photovoltaics, vol. 7, No. 2, Mar. 2017, pp. 479-485 (Year: 2017).*

Bachman, RCA-2 Silicon Wafer Cleaning, Spring (no month) 2002, available online at https://phas.ubc.ca/~ampel/nanofab/sop/rca-clean-2.pdf (Year: 2002).*

Bersch et al., "Complete band offset characterization of the HfO2/SiO2/Si stack using charge corrected x-ray photoelectron spectroscopy", J. Appl. Phys. 107, 043702 (2010).

Office Action received in corresponding Korea Patent Application 10-2020-0076732 (dated Nov. 27, 2021) (12 pages) (machine translation included).

Chen et al., "Atomic layer-deposited tunnel oxide stabilizes silicon photoanodes for water oxidation", Nature Materials, vol. 10, pp. 539-544 (Jul. 2011).

* cited by examiner

Fig. 7
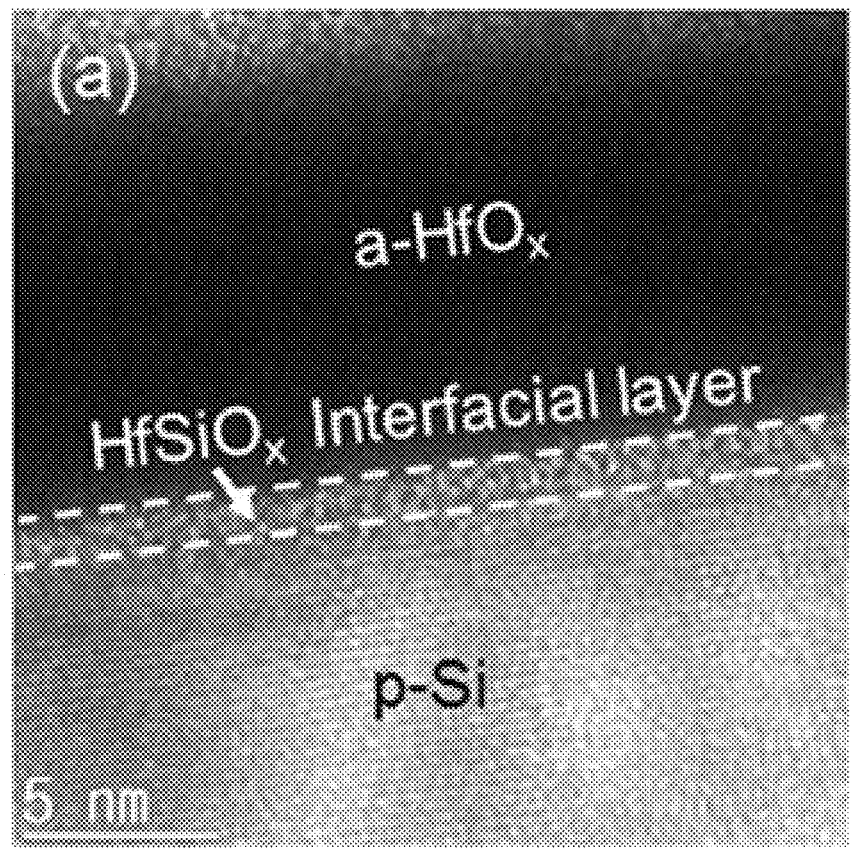
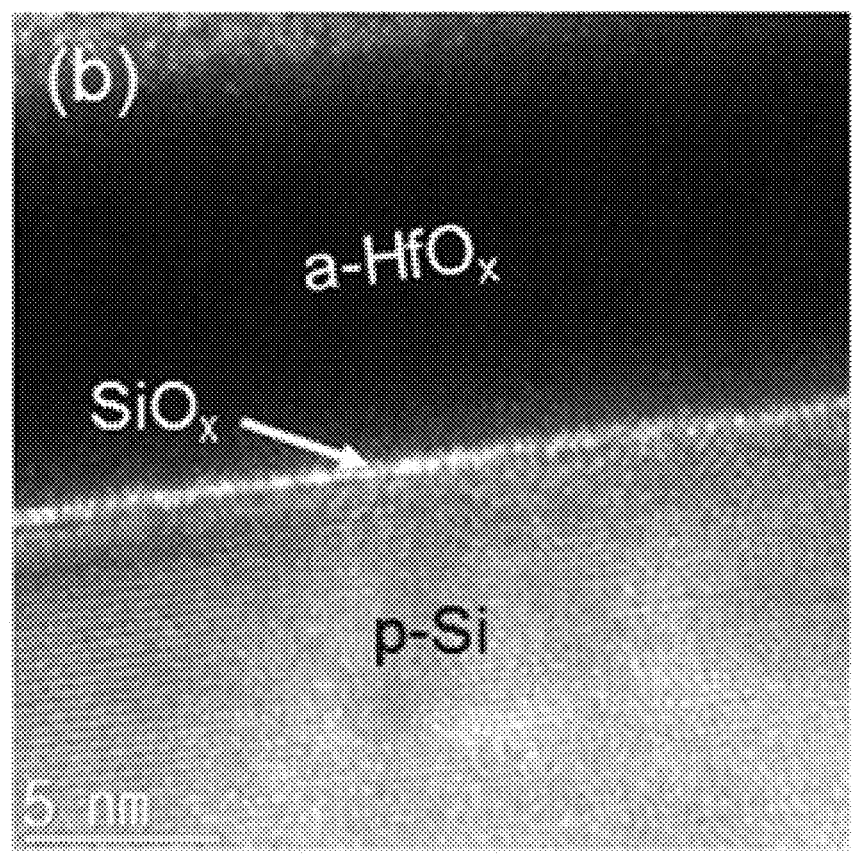

Solid line: Experimental Example 3-1 (1.4 nm)
Dot line: Experimental Example 3-4 (2.4 nm)

Thick solid line: Experimental Example 3-1 (1.4 nm)

Dot line: Experimental Example 3-2 (1.6 nm)

Thin dot line: Experimental Example 3-3 (1.8 nm)

[Fig. 17]
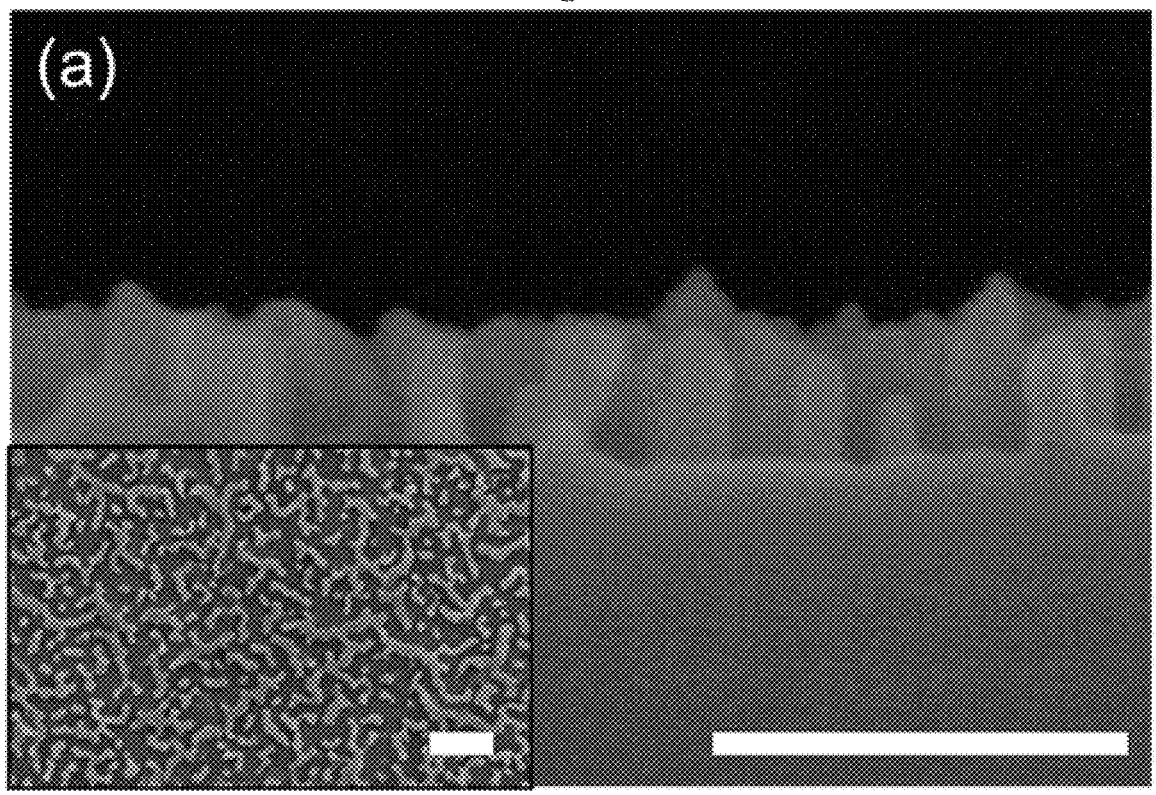
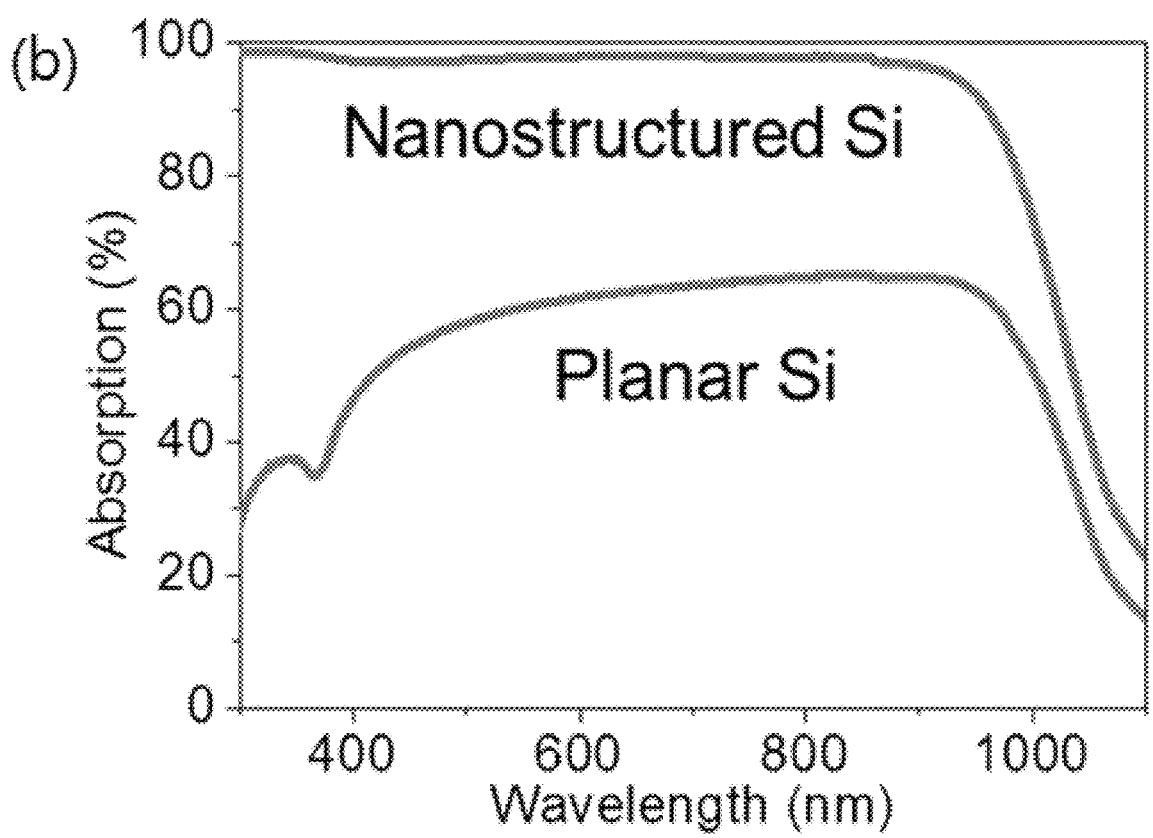

Fig. 20
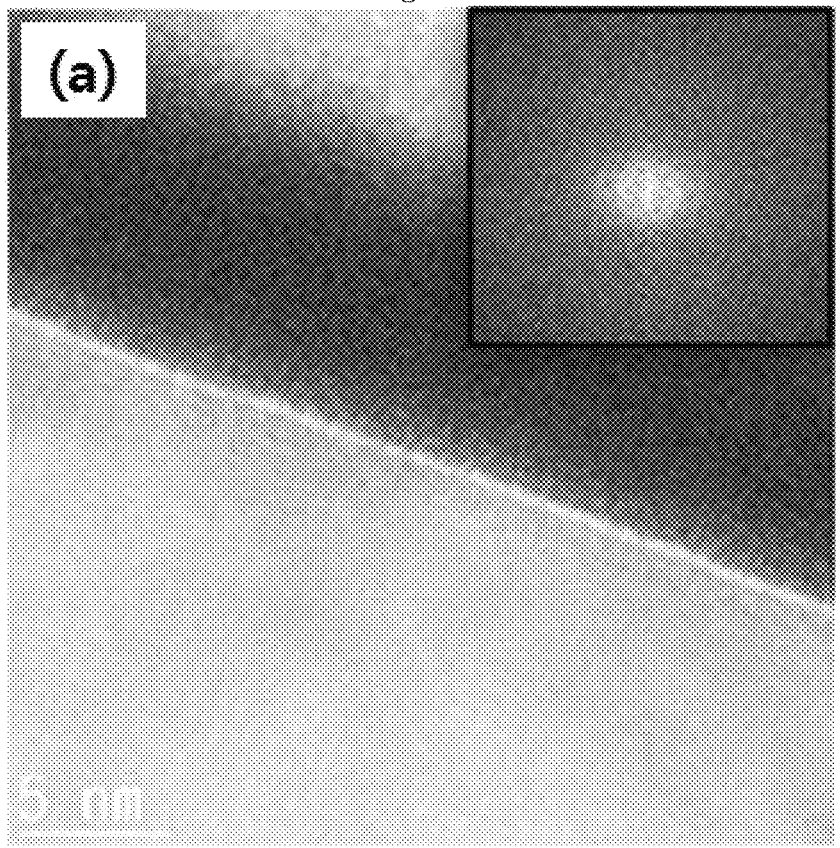
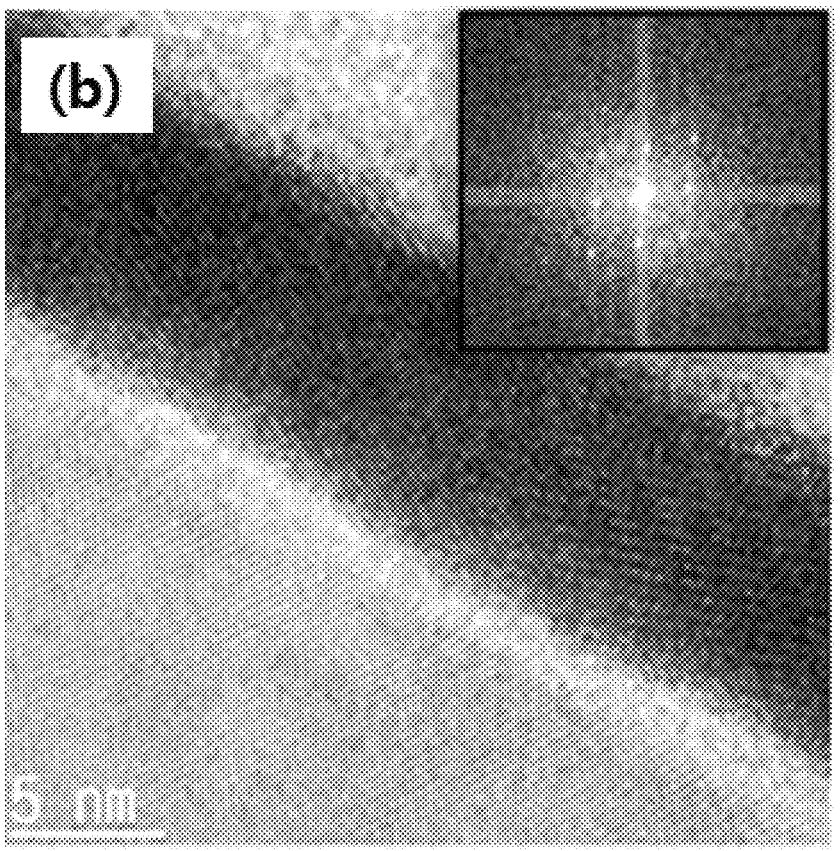

PHOTOCATHODE STRUCTURE, METHOD
OF FABRICATING THE SAME, AND HYBRID
ELECTRIC GENERATING ELEMENT
INCLUDING THE SAME

BACKGROUND OF THE INVENTION

1. Field of the Invention

The present disclosure relates to a photocathode structure, a method of fabricating the same, and an electrochemical cell including the same, and more particularly, to a photocathode structure having a structure in which a photocathode including silicon, an intermediate layer including a silicon oxide, and a protective layer including a metal oxide are sequentially stacked, wherein the intermediate layer is a tunneling barrier configured to transfer charges from the photocathode to the protective layer by an electric field applied from an outside, a method of fabricating the photocathode structure, and an electrochemical cell including the photocathode structure.

2. Description of the Prior Art

Since solar water-splitting systems are capable of generating renewable energy such as a hydrogen fuel by using solar energy, the solar water-splitting systems have been spotlighted as a new energy industry.

Accordingly, in order to develop a system capable of spontaneously performing a water-splitting reaction by receiving solar energy, a hybrid system between a photoelectrochemical cell configured to perform a water-splitting reaction and an element configured to generate energy by solar energy has been studied.

A hybrid system in which a photoelectrochemical cell and a photovoltaic electrolysis cell are combined has been spotlighted in that the hybrid system may theoretically generate an output voltage that is higher than the sum of a thermodynamic potential and a dynamic potential required for a water-splitting reaction. However, a photoelectric loss occurred by a photovoltaic effect.

In order to overcome such a limitation, in recent years, combination with an element driven by a thermal gradient or a piezoelectric effect has been attempted. For example, Korean Unexamined Patent Publication No. 10-2019-0073895 (Application No. 10-2017-0175129) discloses a solar cell thermoelectric fusion element including: a thermoelectric element unit; a heating electrode located on the thermoelectric element unit, and configured to serve to perform infrared absorption and heat transfer; and a solar cell unit located on the heating electrode, wherein the heating electrode functions as a rear electrode of the solar cell unit.

SUMMARY OF THE INVENTION

One technical object of the present disclosure is to provide a photocathode structure, a method of fabricating the same, and an electrochemical cell including the same, in which an intermediate layer having a first dielectric constant and a protective layer having a second dielectric constant that is higher than the first dielectric constant are sequentially stacked on a photocathode, so that the intermediate layer is configured as a tunneling barrier by an electric field applied from an outside.

Another technical object of the present disclosure is to provide a photocathode structure, a method of fabricating the same, and an electrochemical cell including the same, in which a protective layer configured to prevent reflection of incident light irradiated to a photocathode is included, so that cell characteristics are improved.

The technical objects of the present disclosure are not limited to the above-described objects.

In order to achieve the above technical objects, the present disclosure provides a photocathode structure.

In accordance with an embodiment, the photocathode structure includes: a photocathode including silicon (Si); an intermediate layer disposed on the photocathode, and including a silicon oxide; and a protective layer disposed on the intermediate layer, and including a metal oxide, wherein the intermediate layer is a tunneling barrier configured to transfer charges from the photocathode to the protective layer by an electric field applied from an outside.

According to an embodiment, the silicon oxide may have a first dielectric constant, and the metal oxide may have a second dielectric constant that is higher than the first dielectric constant.

According to an embodiment, the protective layer may be changed from an amorphous state to a crystalline state by the electric field applied from the outside.

According to an embodiment, the metal oxide may include at least one of a hafnium oxide, a zirconium oxide, a tantalum oxide, a titanium oxide, an aluminum oxide, or a strontium titanate.

In order to achieve the above technical objects, the present disclosure provides a hybrid electric generating element.

In accordance with an embodiment, the hybrid electric generating element includes: a photoelectrochemical cell including the photocathode structure; and a thermoelectric element connected in series with the photoelectrochemical cell.

According to an embodiment, while a temperature difference provided to the thermoelectric element exceeds 54° C., a water-splitting reaction of the photoelectrochemical cell may be performed.

According to an embodiment, a thickness of an intermediate layer of the photocathode structure may be controlled according to a power that is suppliable from the thermoelectric element to the photoelectrochemical cell.

In order to achieve the above technical objects, the present disclosure provides a method of fabricating a photocathode structure.

In accordance with an embodiment, the method of fabricating the photocathode structure includes: preparing a photocathode including a silicon substrate; forming an intermediate layer including a silicon oxide on the photocathode by treating the photocathode including the silicon substrate with hot water; and forming a protective layer including a metal oxide on the intermediate layer to fabricate the photocathode structure.

According to an embodiment, the preparing of the photocathode may include preparing the silicon substrate having a hydrogenated surface by immersing a single-crystal silicon substrate in a diluted hydrogen fluoride solution.

According to an embodiment, a thickness of the intermediate layer may be controlled according to a time required for treating the photocathode with the hot water, and hydrogen generation efficiency may be controlled according to the time required for treating the photocathode with the hot water.

According to an embodiment, the forming of the protective layer may be performed by an atomic layer deposition process.

In accordance with an embodiment of the present disclosure, the method of fabricating the photocathode structure includes: preparing a photocathode including a p-type silicon substrate; forming an intermediate layer including a silicon oxide on the photocathode; and forming a protective layer including a metal oxide on the intermediate layer to fabricate the photocathode structure.

The preparing of the photocathode may include immersing a single-crystal silicon substrate in a diluted hydrogen fluoride solution, so that a native oxide formed on a surface of the single-crystal silicon substrate can be removed, and simultaneously, the surface of the single-crystal silicon substrate can be hydrogenated.

The forming of the intermediate layer may include treating the p-type silicon substrate with hot water, so that the silicon oxide can be formed on a surface of the p-type silicon substrate.

The forming of the protective layer may be performed by an atomic layer deposition scheme, and the protective layer prepared as described above may have a higher dielectric constant than the silicon oxide. In other words, the intermediate layer and the protective layer may be dielectric thin films having dielectric constants, and the intermediate layer may have a lower dielectric constant than the protective layer. Therefore, an electric field applied from an outside can be mainly provided to the intermediate layer as compared with the protective layer, so that the intermediate layer can be a tunneling barrier for charges moving from the photocathode to the protective layer.

In addition, the protective layer may be in an amorphous state, and may be changed to a crystalline state by the electric field applied from the outside, so that defects in the protective layer can be reduced, and thus electrical conduction characteristics of the photocathode structure can be improved.

BRIEF DESCRIPTION OF THE DRAWINGS

FIG. 7 is a view showing a high-resolution transmission electron microscope (TEM) image of the photocathode structure according to the embodiment of the present invention.

FIG. 17 is view showing a scanning electron microscope (SEM) image of a section of the photocathode structure according to the embodiment of the present invention, and a graph obtained by measuring a light absorption rate of a photocathode structure having a protrusion.

FIG. 20 is a view obtained by capturing a transmission electron microscope (TEM) image of a protective layer before and after the stabilization of the photocathode structure according to the embodiment of the present invention.

DETAILED DESCRIPTION OF THE EXEMPLARY EMBODIMENTS

Figure 1:
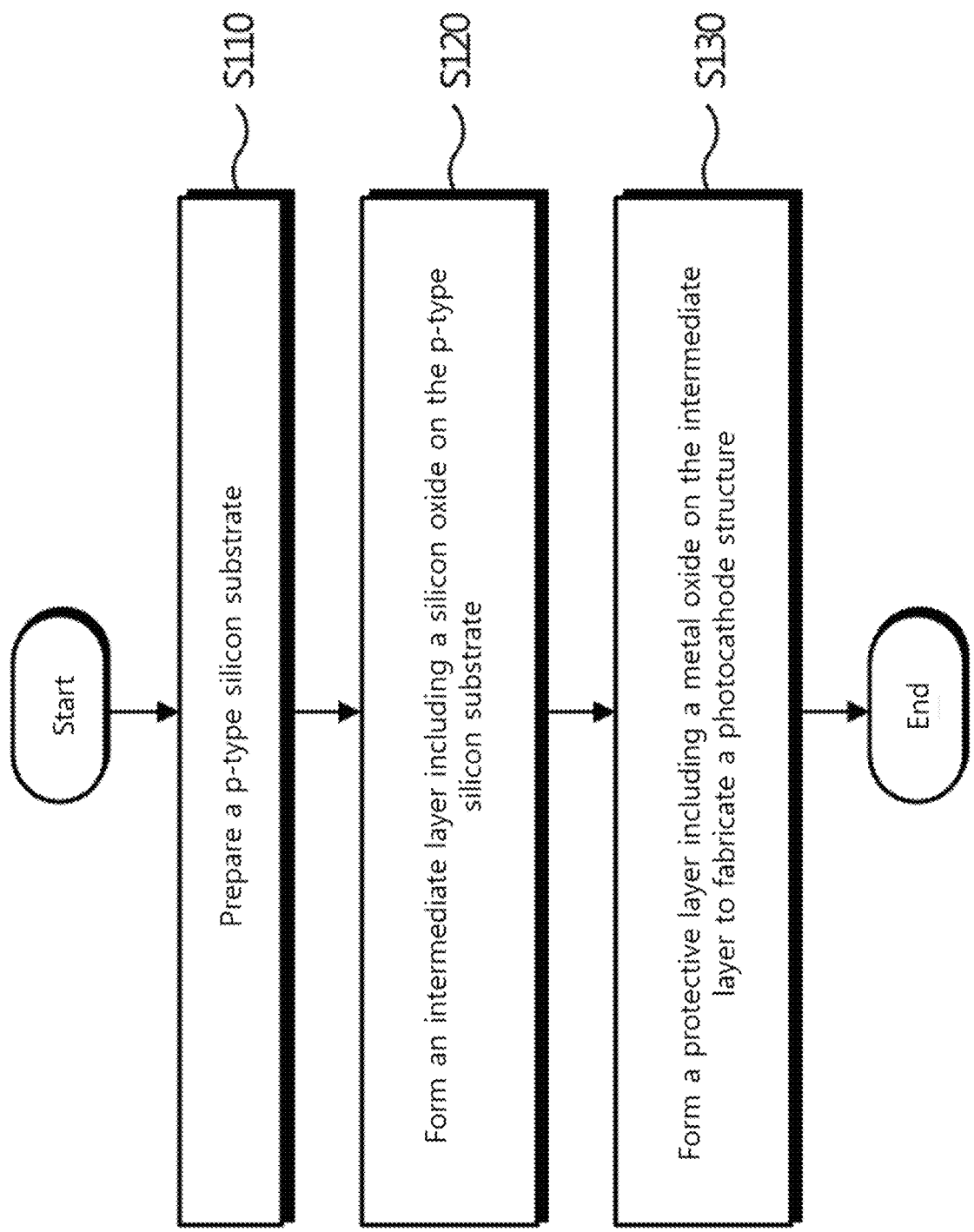
FIG. 1 is a flowchart for describing a method of fabricating a photocathode structure according to an embodiment of the present invention.

Hereinafter, exemplary embodiments of the present disclosure will be described in detail with reference to the accompanying drawings. However, the technical idea of the present disclosure is not limited to the embodiments, but may be realized in different forms. The embodiments introduced herein are provided to sufficiently deliver the idea of the present disclosure to those skilled in the art so that the disclosed contents may become thorough and complete.

When it is mentioned in the present disclosure that one element is on another element, it means that a first element may be directly formed on a second element, or a third element may be interposed between the first element and the second element. Further, in the drawings, thicknesses of membranes and areas are exaggerated for efficient description of the technical contents.

In addition, in the various embodiments of the present disclosure, the terms such as first, second, and third are used to describe various elements, but the elements are not limited to the terms. The terms are used only to distinguish one element from another element. Therefore, an element mentioned as a first element in one embodiment may be mentioned as a second element in another embodiment. The embodiments described and illustrated herein include their complementary embodiments. Further, the term "and/or" used herein is used to include at least one of the elements enumerated before and after the term.

As used herein, the terms of a singular form may include plural forms unless the context clearly indicates otherwise. Further, the tams such as "including" and "having" are used to designate the presence of features, numbers, steps, elements, or combinations thereof described in the present disclosure, and shall not be construed to preclude any possibility of presence or addition of one or more other features, numbers, steps, elements, or combinations thereof.

Further, in the following description of the present disclosure, detailed descriptions of known functions and configurations incorporated herein will be omitted when they may make the subject matter of the present disclosure unnecessarily unclear.

Figure 2:
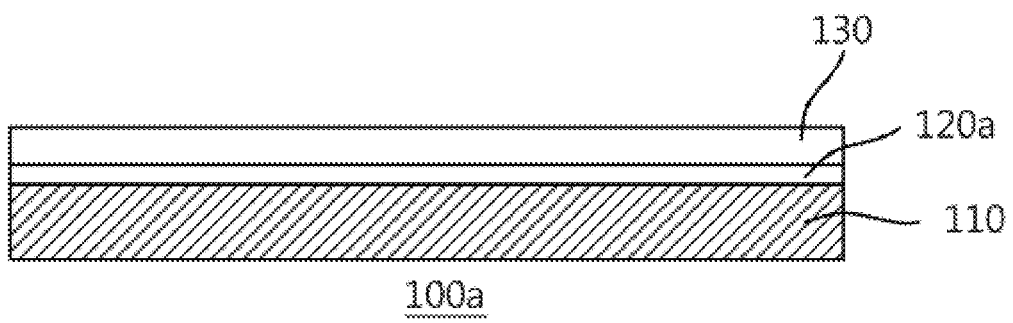
FIG. 2 is a schematic view showing a photocathode structure according to an embodiment of the present invention.
Figure 3:
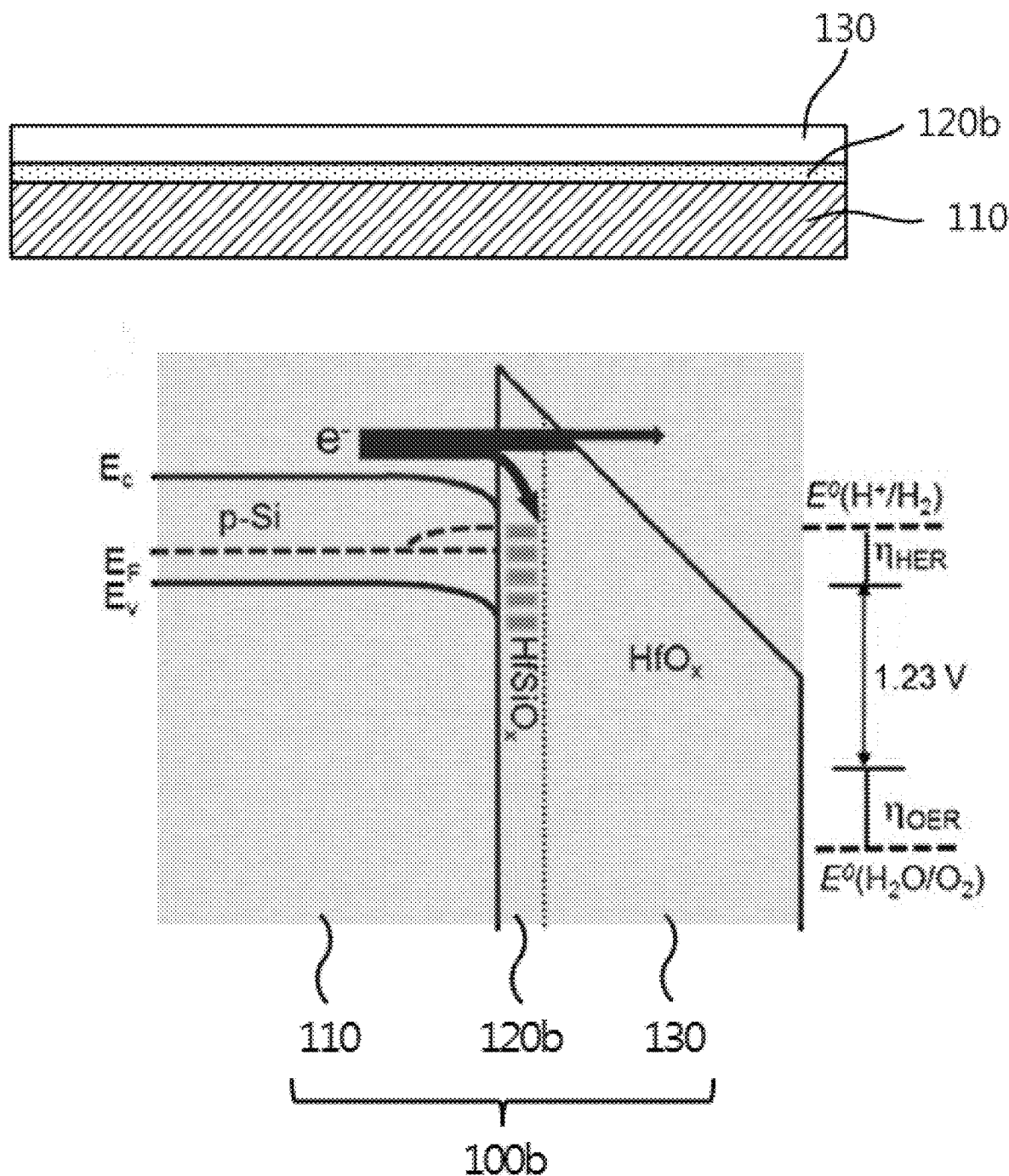
FIGS. 3 and 4 are views for describing a band diagram of the photocathode structure according to the embodiment of the present invention.
Figure 4:
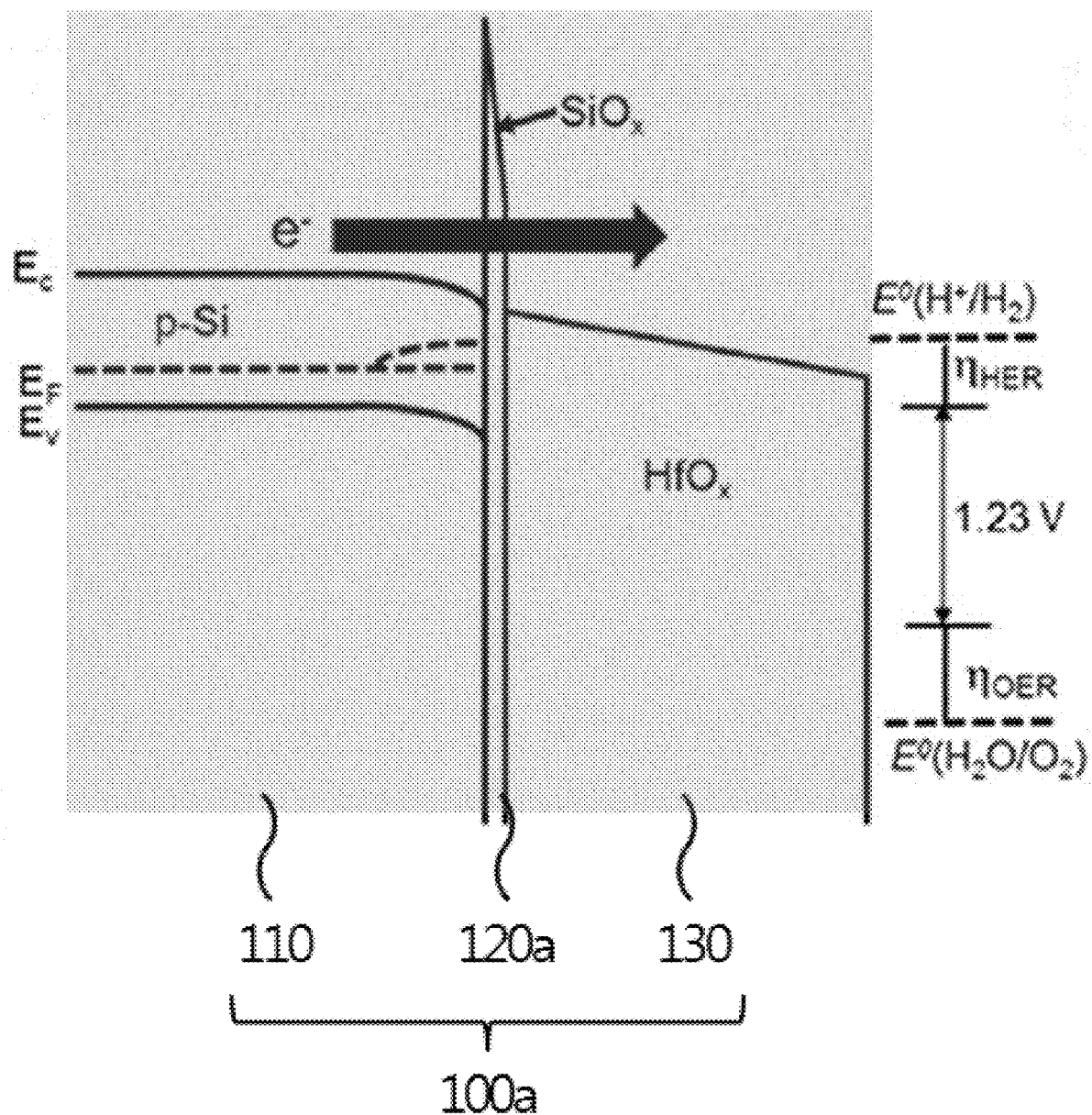

FIG. 1 is a flowchart for describing a method of fabricating a photocathode structure according to an embodiment of the present invention, FIG. 2 is a schematic view showing a photocathode structure according to an embodiment of the present invention, and FIGS. 3 and 4 are views for describing a band diagram of the photocathode structure according to the embodiment of the present invention.

Referring to FIGS. 1 and 2, a photocathode 110 including a p-type silicon substrate may be prepared (S110).

According to one embodiment, the photocathode 110 may be prepared by functionalizing a surface of a single-crystal silicon substrate with hydrogen (H-terminated surface).

In detail, for example, the single-crystal silicon substrate may be immersed in a diluted hydrogen fluoride solution. Accordingly, a native oxide formed on the surface of the single-crystal silicon substrate may be removed, and simultaneously, the surface of the single-crystal silicon substrate may be functionalized with hydrogen, so that the photocathode 110 may be prepared.

A first intermediate layer 120a including a silicon oxide may be formed on the photocathode 110 (S120).

According to one embodiment, the first intermediate layer 120a may be prepared by treating the photocathode 110 with hot water. In detail, for example, the photocathode 110 may be provided into water at 90° C., so that the first intermediate layer 120a may be formed on a surface of the photocathode 110.

Unlike the above-described configuration, the first intermediate layer 120a may be prepared by rapid thermal oxidation (RTO) in which light energy is irradiated onto the photocathode 110. In this case, a voltage consumed in a water-splitting reaction of a photocathode structure 100a including the first intermediate layer 120a, which will be described below, may be increased.

However, according to one embodiment, the first intermediate layer 120a may be prepared by treating the photocathode 110 with the hot water, so that power consumption of the water-splitting reaction of the photocathode structure 100a including the first intermediate layer 120a, which will be described below, may be reduced. In other words, a hydrogen generation amount versus the power consumption may be improved.

A protective layer 130 including a metal oxide may be formed on the first intermediate layer 120a to fabricate the photocathode structure 100a (S130).

According to one embodiment, the protective layer 130 may be formed on the first intermediate layer 120a by an atomic layer deposition scheme. In detail, when a step of sequentially providing a metal precursor, a purge gas, an oxygen precursor, and a purge gas is defined as one unit process, the protective layer 130 may be prepared by repeating the unit process, and the protective layer 130 prepared as described above may be in an amorphous state. For example, the metal precursor may be at least one of tetrakis(ethylmethylamino) hafnium (TEMAHf), tetrakis(diethylamino) hafnium (TDEAHf), tetrakis(dimethylamino) hafnium (TDMAHf), or hafnium tetra-tert-butoxide ($Hf[OC(CH_3)_3]_4$).

For example, the purge gas may be at least one of a nitrogen gas or an argon gas.

For example, the oxygen precursor may be at least one of water vapor, an oxygen gas, an ozone gas, or a nitrous oxide ($N_2O$) gas.

In detail, for example, the protective layer 130 may be formed of at least one of a hafnium oxide ($HfO_x$), a zirconium oxide ($ZrO_x$), a tantalum oxide ($TaO_x$), a titanium oxide ($TiO_x$), an aluminum oxide ($AlO_x$), or a strontium titanate ($SrTiO_x$) (where x>0).

According to one embodiment, the surface of the photocathode structure 100a may have a nanostructured protrusion. For example, after the nanostructured protrusion is formed on the surface of the photocathode 110, the first intermediate layer 120a and the protective layer 130 may be formed on the photocathode 110 along a profile of the nanostructured protrusion. In detail, a plurality of metal particles (e.g., silver particles) spaced apart from each other may be prepared on the photocathode 110, the surface of the photocathode 110 may be etched with an etching solution (e.g., hydrofluoric acid) by using the metal particles as a catalyst, and the metal particles may be removed with a cleaning solution (e.g., nitric acid), so that the nanostructured protrusion may be formed on the surface of the photocathode 110. For example, the metal particles may be formed on the photocathode 110 through electroless plating, and the metal particles may be Ag, Pt, Au, Cu, Ni, or the like. Alternatively, as another example, after the protective layer 130 is formed, the nanostructured protrusion may be formed on the surface of the protective layer 130.

Unlike the above-described embodiment of the present invention, the protective layer 130 may be formed directly on a top surface of the photocathode 110 by the atomic layer deposition scheme. In other words, the forming of the protective layer 130 may be performed immediately after the preparing of the photocathode 110 without the forming of the first intermediate layer 120a. Accordingly, the protective layer 130 may make contact with the photocathode 110.

In this case, during the forming of the protective layer 130, silicon elements of the photocathode 110 may diffuse to an interface between the protective layer 130 and the photocathode 110. Accordingly, the protective layer 130 may be formed on the photocathode 110, and simultaneously, a second intermediate layer 120b including the silicon elements and the metal oxide of the protective layer 130 may be formed between the photocathode 110 and the protective layer 130.

In this case, as shown in FIG. 3, the second intermediate layer 120b and the protective layer 130 may form a triangular barrier, so that an amount of charges transferred from the photocathode 110 to the protective layer 130 may be reduced.

However, according to an embodiment of the present invention, the protective layer 130 may be formed on the first intermediate layer 120a. In this case, the first intermediate layer 120a may be the silicon oxide. In other words, the first intermediate layer 120a may include a silicon-oxygen bond. Meanwhile, the photocathode 110 may include a silicon-hydrogen bond as the surface of the photocathode 110 is functionalized with hydrogen. In this case, the silicon-oxygen bond may have a higher bonding strength than the silicon-hydrogen bond, so that the first intermediate layer 120a having the silicon-oxygen bond may prevent the silicon elements from diffusing from the photocathode 110 to the protective layer 130.

Therefore, the photocathode structure 100a may have a structure in which the photocathode 110, the first intermediate layer 120a, and the protective layer 130 are sequentially stacked.

In this case, the photocathode structure 100a may include the intermediate layer 120a having a first atomic density and the protective layer 130 having a second atomic density that is higher than the first atomic density.

In addition, the photocathode structure 100a may include the intermediate layer 120a having a first dielectric constant and the protective layer 130 having a second dielectric constant that is higher than the first dielectric constant. In other words, the photocathode structure 100a may include dielectric thin films stacked on the photocathode 110 and having mutually different dielectric constants.

Accordingly, the amount of charges transferred from the photocathode 110 to the protective layer 130 in the photocathode structure 100a may be reduced. In other words, a voltage applied to the photocathode structure 100a may be dropped by the protective layer 130 and the first intermediate layer 120a.

$$V_{OX} = E_{inter} t_{inter} + E_{pro} t_{pro} \qquad \text{<Formula 1>}$$

In Formula 1, $E_{inter}$ denotes an electric field applied to the first intermediate layer 120a, $t_{inter}$ denotes a thickness of the first intermediate layer 120a, $E_{pro}$ denotes an electric field applied to the protective layer 130, and $t_{pro}$ denotes a thickness of the protective layer 130.

In this case, the protective layer 130 and the first intermediate layer 120a may have relation represented by Formula 2 as follows. In other words, a product of the electric field applied to the protective layer 130 and a dielectric constant ($\varepsilon_{pro}$) of the protective layer 130 may be equal to a product of the electric field applied to the first intermediate layer 120a and a dielectric constant ($\varepsilon_{inter}$) of the first intermediate layer 120a.

$$E_{pro} = \left(\frac{\varepsilon_{inter}}{\varepsilon_{pro}}\right) E_{inter} \qquad \text{< Formula 2 >}$$

As described above, the protective layer 130 may have the dielectric constant that is higher than the dielectric constant of the first intermediate layer 120a, so that the electric field applied to the first intermediate layer 120a may have a greater value than the electric field applied to the protective layer 130. In other words, the electric field applied to the photocathode structure 100a may be mainly provided to the first intermediate layer 120a as compared with the protective layer 130, so that the voltage drop of the photocathode structure 100a may be determined by the thickness of the first intermediate layer 120a.

In other words, as shown in FIG. 4, the photocathode structure 100a may include the first intermediate layer 120a as an energy barrier. In this case, as described above, the electric field may be mainly applied to the first intermediate layer 120a as compared with the protective layer 130, so that an energy barrier thickness of the first intermediate layer 120a may be reduced. Therefore, the charges provided to the photocathode 110 may tunnel through the first intermediate layer 120a so as to be transferred to the protective layer 130.

According to one embodiment, as described above, the protective layer 130 may be in the amorphous state, and may be changed to a crystalline state by an electric field applied from an outside. Accordingly, defects in the protective layer 130 may be reduced, so that charge conduction characteristics of the photocathode structure 100a may be improved.

Figure 5:
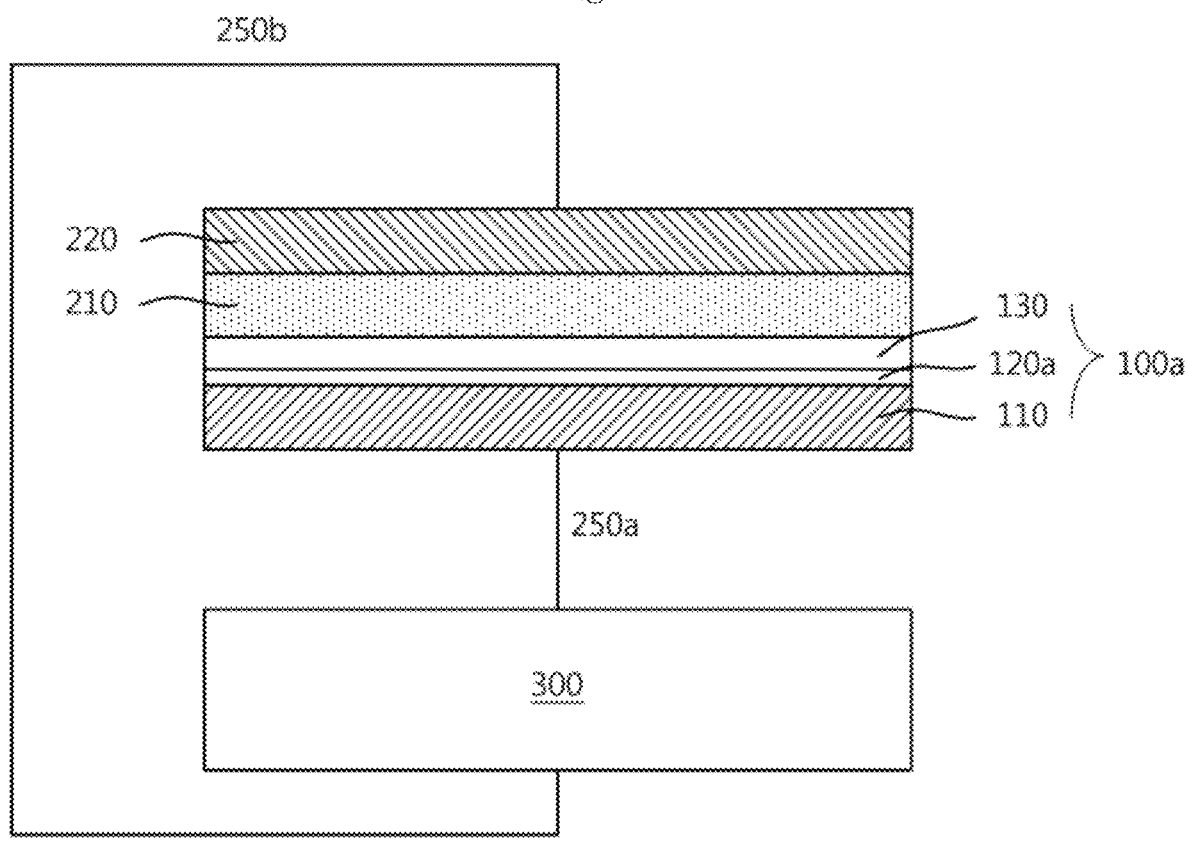
FIG. 5 is a schematic view showing a hybrid electric generating element according to an embodiment of the present invention.
Figure 6:
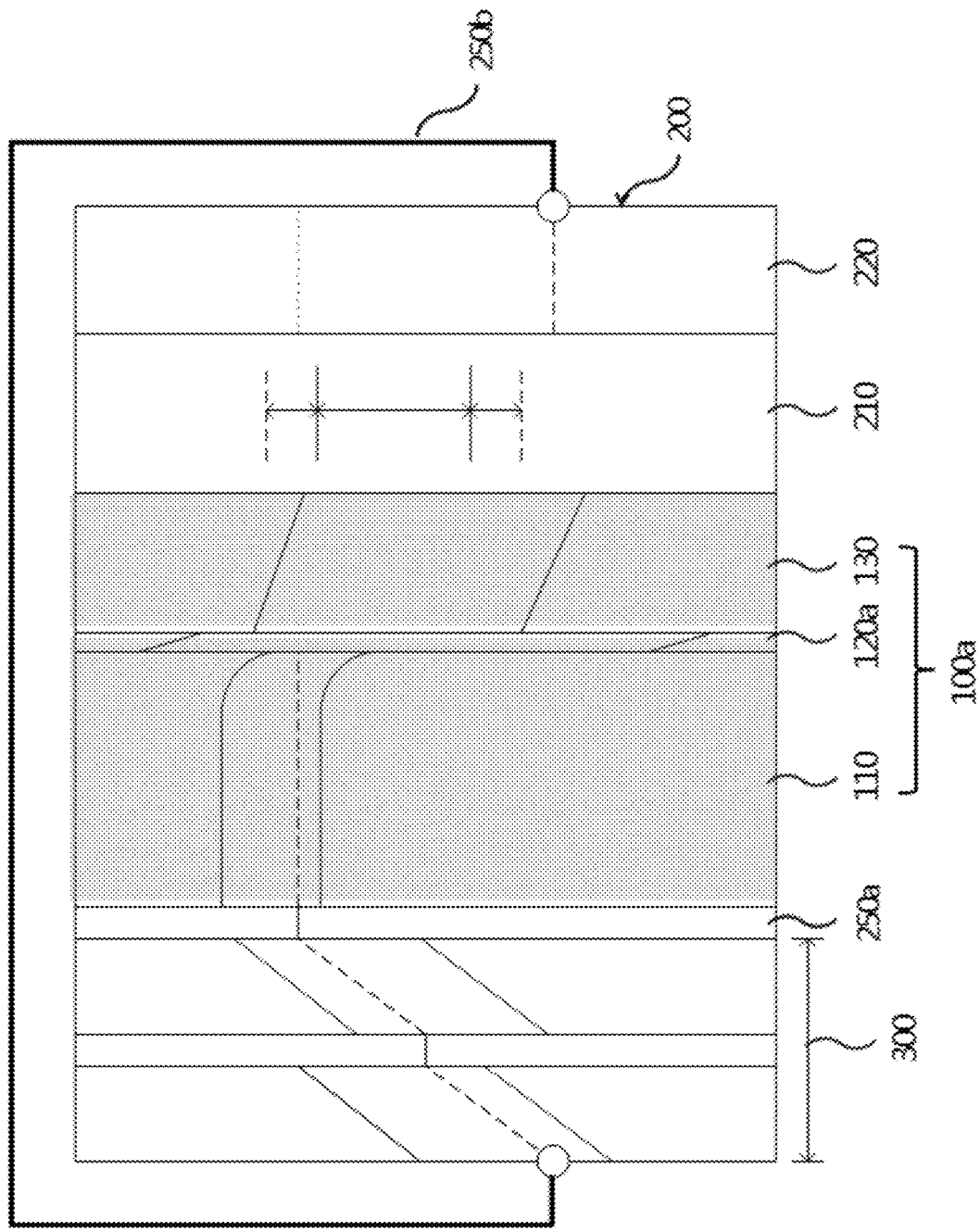
FIG. 6 is a view showing a band diagram of the hybrid electric generating element according to the embodiment of the present invention.

FIG. 5 is a schematic view showing a hybrid electric generating element according to an embodiment of the present invention, and FIG. 6 is a view showing a band diagram of the hybrid electric generating element according to the embodiment of the present invention.

Referring to FIGS. 5 and 6, a hybrid electric generating element including a photoelectrochemical cell 200 including the photocathode structure 100a described above with reference to FIGS. 1 to 4, and a thermoelectric element 300 connected in series with the photoelectrochemical cell 200 may be fabricated.

In detail, the photoelectrochemical cell 200 may include the photocathode structure 100a, a photoanode 220 spaced apart from the photocathode structure 100a, and an electrolyte 210 disposed between the photocathode structure 100a and the photoanode 220. In addition, the photoelectrochemical cell 200 may be electrically connected to the thermoelectric element 300 through conductive wires 250a and 250b.

For example, the electrolyte 210 of the photoelectrochemical cell 200 may be at least one of sulfuric acid, nitric acid, hydrochloric acid, or acetic acid.

For example, the photoanode 220 of the photoelectrochemical cell may be formed of at least one of platinum (Pt), tantalum (Ta), silver (Ag), or gold (Au).

For example, the conductive wires 250a and 250b may be formed of at least one of copper (Cu), gold (Au), or silver (Ag).

According to one embodiment, the hybrid electric generating element may be configured such that a water-splitting reaction of the photoelectrochemical cell is performed while a temperature difference of the thermoelectric element exceeds 54° C. In other words, when the temperature difference of the thermoelectric element exceeds 54° C., cell characteristics of the photoelectrochemical cell may be implemented without the electric field applied from the outside.

When the temperature difference of the thermoelectric element is less than or equal to 54° C., it may not be substantially easy to perform the water-splitting reaction by the photoelectrochemical cell without the electric field applied from the outside.

However, according to one embodiment, the temperature difference of the thermoelectric element may exceed 54° C., so that it may be substantially easy to perform the water-splitting reaction by the photoelectrochemical cell without the electric field applied from the outside. In other words, as shown in FIG. 6, when the temperature difference of the thermoelectric element exceeds 54° C., Fermi energy of the photoanode 220 of the photoelectrochemical cell may become lower than an oxygen generation level. Accordingly, the photoelectrochemical cell may spontaneously implement the cell characteristics.

Hereinafter, a method of fabricating a photocathode structure according to a specific experimental example of the present invention and a characteristic evaluation result will be described.

Fabrication of Photocathode Structures According
to Comparative Example 1-1 and Comparative
Example 1-2

A single-crystal silicon substrate having a resistivity of 1 to 10Ω was prepared.

The single-crystal silicon substrate was immersed in a diluted hydrogen fluoride solution to remove a native oxide formed on a surface of the single-crystal silicon substrate, and simultaneously, to functionalize the surface of the single-crystal silicon substrate with hydrogen, so that a p-type silicon substrate was prepared.

A protective layer including a hafnium oxide was formed on the p-type silicon substrate by a cycle of "tetrakis (ethylmethylamino) hafnium (TEMAHf) for 2.5 seconds→nitrogen gas purge for 30 seconds→water vapor for 1.5 seconds" through an atomic layer deposition scheme in a temperature range of 280° C., so that photocathode structures according to Comparative example 1-1 and Comparative example 1-2 were fabricated.

Fabrication of Photocathode Structure According to
Experimental Example 1

A single-crystal silicon substrate having a resistivity of 1 to 10Ω was prepared.

The single-crystal silicon substrate was immersed in a diluted hydrogen fluoride solution to remove a native oxide formed on a surface of the single-crystal silicon substrate, and simultaneously, to functionalize the surface of the single-crystal silicon substrate with hydrogen, so that a p-type silicon substrate was prepared.

The p-type silicon substrate was provided in hot water having a temperature of 90° C. for 10 minutes, so that a first intermediate layer including a silicon oxide was formed on the p-type silicon substrate, and thus a photocathode structure according to Experimental example 1 was fabricated.

Fabrication of Photocathode Structure According to
Comparative Example 2

A single-crystal silicon substrate having a resistivity of 1 to 10Ω was prepared.

The single-crystal silicon substrate was immersed in a diluted hydrogen fluoride solution to remove a native oxide formed on a surface of the single-crystal silicon substrate, and simultaneously, to functionalize the surface of the single-crystal silicon substrate with hydrogen, so that a p-type silicon substrate was prepared.

A first intermediate layer including a silicon oxide was formed on the p-type silicon substrate by rapid thermal oxidation (RTO), so that a photocathode structure according to Comparative example 2 was fabricated.

Fabrication of Photocathode Structures According
to Experimental Example 2-1 to Experimental
Example 2-3

A single-crystal silicon substrate having a resistivity of 1 to 10Ω was prepared.

The single-crystal silicon substrate was immersed in a diluted hydrogen fluoride solution to remove a native oxide formed on a surface of the single-crystal silicon substrate, and simultaneously, to functionalize the surface of the single-crystal silicon substrate with hydrogen, so that a p-type silicon substrate was prepared.

The p-type silicon substrate was provided in hot water having a temperature of 90 t for 10 to 30 minutes, so that a first intermediate layer including a silicon oxide was formed on the p-type silicon substrate.

A protective layer including a hafnium oxide was formed on the first intermediate layer over the p-type silicon substrate by a cycle of "tetrakis(ethylmethylamino) hafnium (TEMAHf) for 2.5 seconds→nitrogen gas purge for 30 seconds→water vapor for 1.5 seconds" through an atomic layer deposition scheme in a temperature range of 280° C., so that photocathode structures according to Experimental example 2-1 to Experimental example 2-3 were fabricated.

Experimental conditions of the photocathode structures according to Comparative example 1-1, Comparative example 1-2, Experimental example 1, Comparative example 2, and Experimental example 2-1 to Experimental example 2-3 described above and thicknesses of the protective layers were listed in Table 1 as follows.

TABLE 1

| | Method of Preparing Intermediate Layer | Thickness of Protective Layer (nm) |
|---|---|---|
| Comparative example 1-1 | — | 9 |
| Comparative example 1-2 | — | 5 |
| Experimental example 1 | Hot water treatment, 10 min | — |
| Comparative example 2 | RTO | 9 |
| Experimental example 2-1 | Hot water treatment, 10 min | 9 |
| Experimental example 2-2 | Hot water treatment, 10 min | 5 |
| Experimental example 2-3 | Hot water treatment, 30 min | 9 |

FIG. 7 is a view showing a high-resolution transmission electron microscope (TEM) image of the photocathode structure according to the embodiment of the present invention.

Referring to FIG. 7, sections of the photocathode structures according to Comparative example 1-1 and Experimental example 2-1 of the present invention were photographed.

The photocathode structure according to Comparative example 1-1 of the present invention was fabricated by forming the protective layer including the hafnium oxide on the p-type silicon substrate without an intermediate layer. In this case, the silicon elements of the p-type silicon substrate diffused to an interface between the p-type silicon substrate and the protective layer. Accordingly, as shown in FIG. 7(a), it was found that the photocathode structure according to Comparative example 1-1 includes the p-type silicon substrate, the protective layer including the hafnium oxide, and a second intermediate layer formed between the p-type silicon substrate and the protective layer and including a silicon hafnium oxide (SiHfO$_x$) having a thickness of approximately 3 nm.

Meanwhile, the photocathode structure according to Experimental example 2-1 of the present invention was fabricated by sequentially stacking the p-type silicon substrate, the first intermediate layer including the silicon oxide, and the protective layer including the hafnium oxide. Accordingly, as shown in FIG. 7(b), it was found that the photocathode structure according to Experimental example 2-1 has a structure in which the p-type silicon substrate, the silicon oxide, and the hafnium oxide are sequentially stacked.

In other words, unlike the photocathode structure according to Comparative example 1-1, it was found that the photocathode structure according to Experimental example 2-does not substantially allow the silicon elements to diffuse from the p-type silicon substrate.

In detail, as described above with reference to FIGS. 1 to 4, the protective layer of the photocathode structure according to Comparative example 1-1 was prepared on the single-crystal silicon substrate having the surface functionalized with hydrogen, and the protective layer of the photocathode structure according to Experimental example 2-1 was formed on the first intermediate layer including the silicon oxide.

In other words, the protective layer of the photocathode structure according to Comparative example 1-1 was prepared on the photocathode including the silicon-hydrogen bond, and the protective layer of the photocathode structure according to Experimental example 2-1 was prepared on the first intermediate layer including the silicon-oxygen bond.

In this case, energy of the silicon-hydrogen bond is approximately 80 kcal/mol, and energy of the silicon-oxygen bond is approximately 190 kcal/mol. In other words, the energy of the silicon-oxygen bond is higher than the energy of the silicon-hydrogen bond, so that the silicon elements may be prevented from diffusing from the p-type silicon substrate.

Therefore, as described above, the photocathode structure according to Comparative example 1-1 may include the silicon hafnium oxide famed by the diffusion of the silicon elements, whereas the photocathode structure according to Experimental example 2-1 may not substantially include the silicon hafnium oxide caused by the diffusion of the silicon elements.

Figure 8:
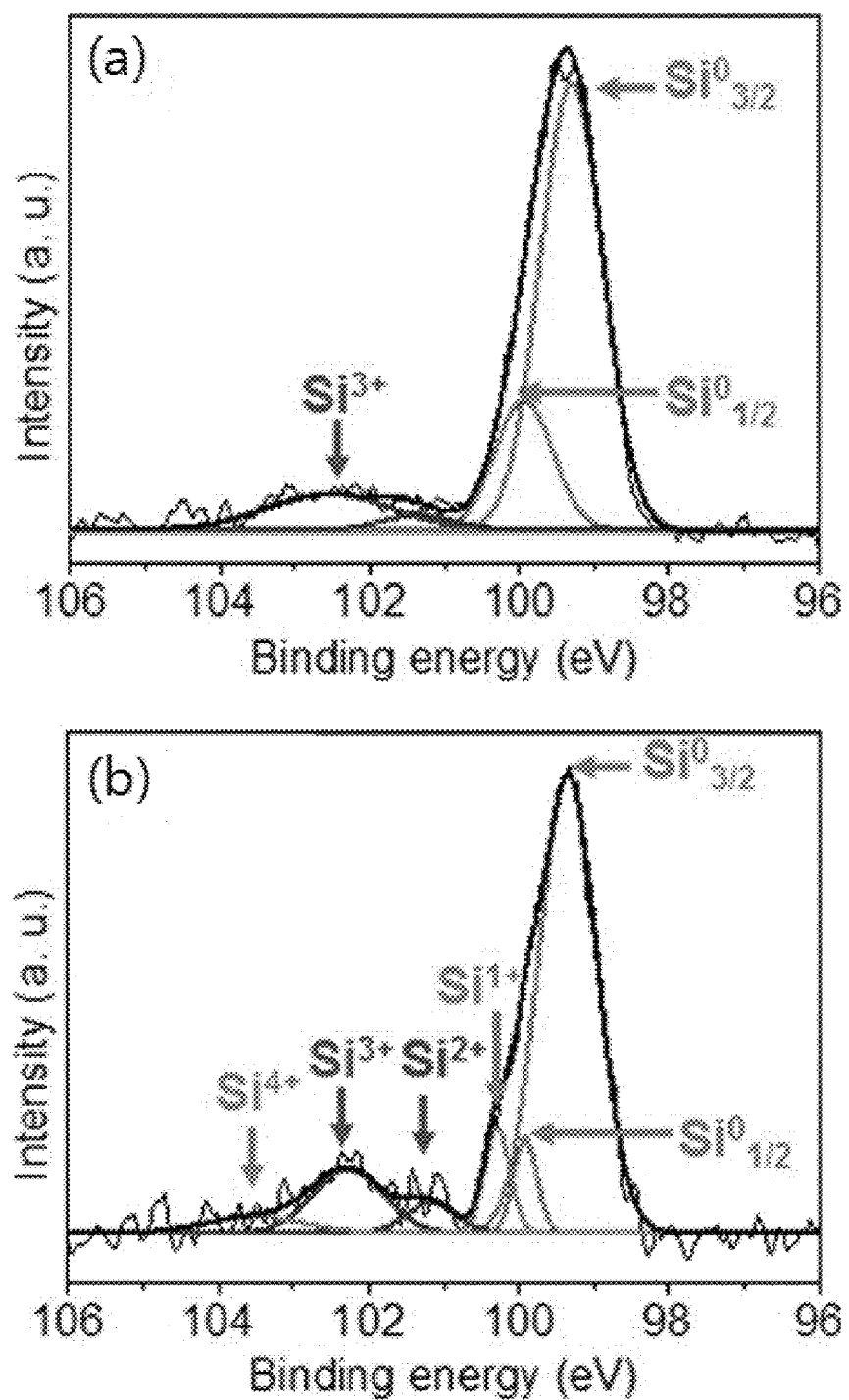
FIG. 8 is a view showing binding energy of silicon elements included in the photocathode structure according to the embodiment of the present invention.

FIG. 8 is a view showing binding energy of silicon elements included in the photocathode structure according to the embodiment of the present invention.

Referring to FIG. 8, types of the silicon elements included in the intermediate layers of the photocathode structures according to Comparative example 1-1 and Experimental example 2-1 of the present invention were observed.

As shown in FIG. 8(*a*), the photocathode structure according to Comparative example 1-1 of the present invention includes the second intermediate layer including the silicon hafnium oxide. Accordingly, it was found that the second intermediate layer mainly includes trivalent silicon ions suitable for a stoichiometric ratio of the silicon hafnium oxide.

Meanwhile, as shown in FIG. 8(*b*), the photocathode structure according to Experimental example 2-1 of the present invention includes the first intermediate layer including the silicon oxide. Accordingly, it was found that the first intermediate layer includes monovalent silicon ions ($Si^{1+}$), divalent silicon ions ($Si^{2+}$), trivalent silicon ions ($Si^{3+}$), and tetravalent silicon ions ($Si^{4+}$).

Figure 9:
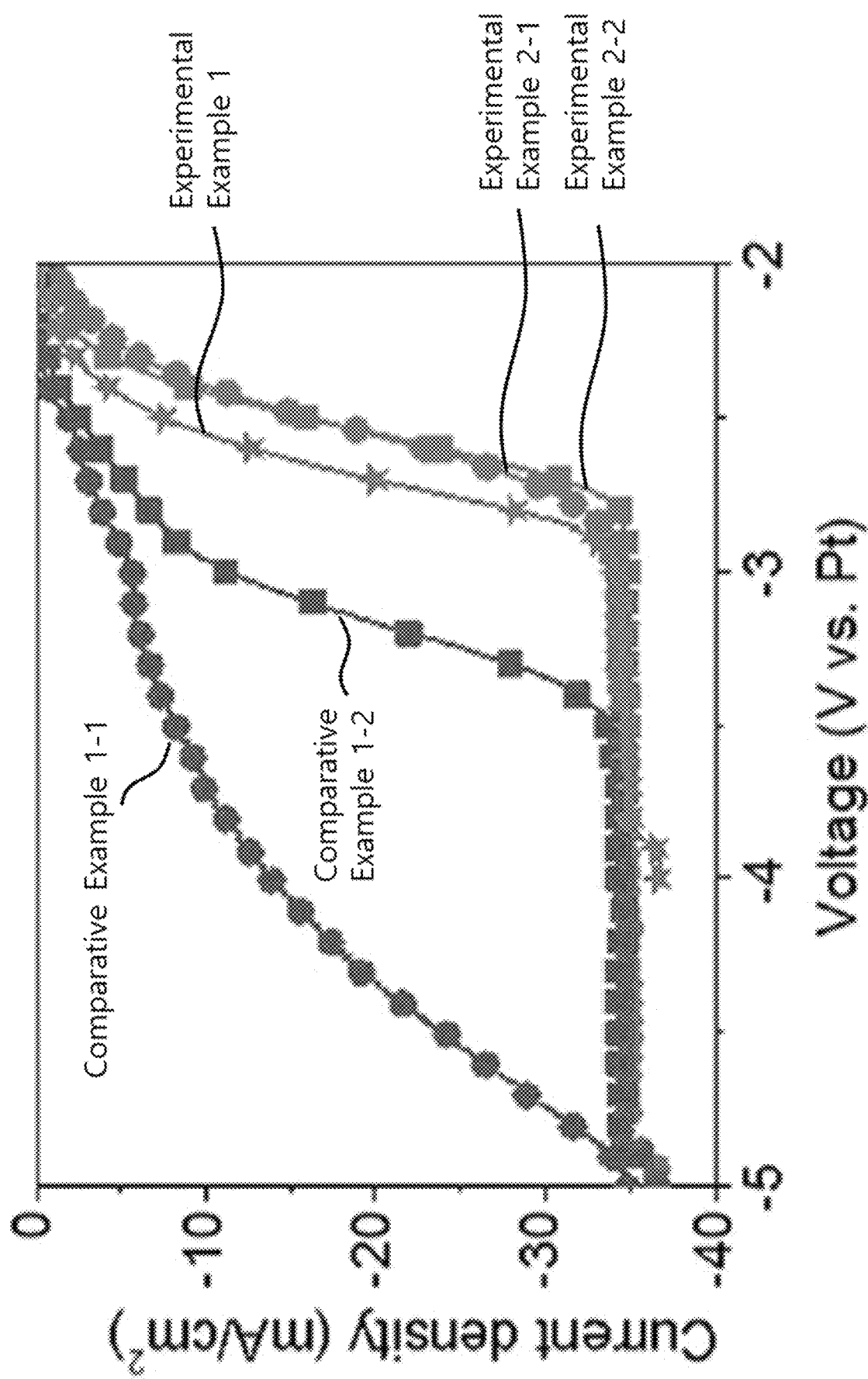
FIGS. 9 and 10 are graphs showing, based on linear sweep voltammetry (LSV), a current density versus a voltage of a photoelectrochemical cell including the photocathode structure according to the embodiment of the present invention.
Figure 10:
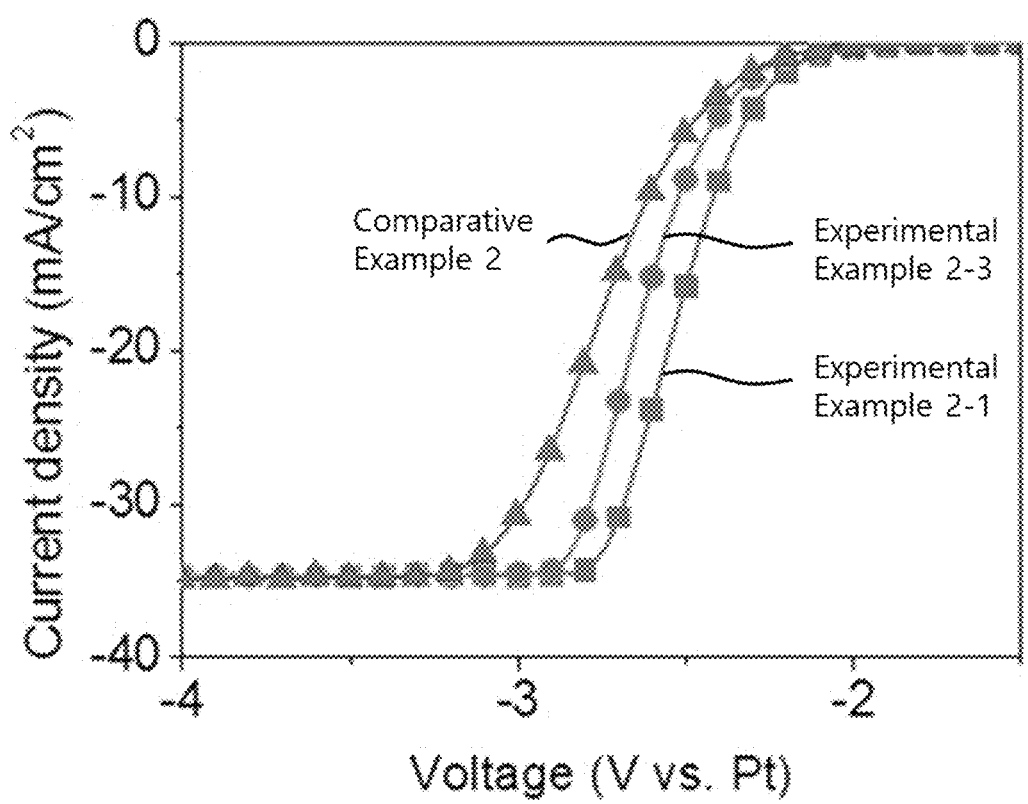

FIGS. 9 and 10 are graphs showing, based on linear sweep voltammetry (LSV), a current density versus a voltage of a photoelectrochemical cell including the photocathode structure according to the embodiment of the present invention.

Referring to FIGS. 9 and 10, cell characteristics of photoelectrochemical cells including the photocathode structures according to Comparative example 1-1, Comparative example 1-2, Experimental example 1, Experimental example 2-1 to Experimental example 2-3, and Comparative example 2 of the present invention were observed.

As shown in FIG. 9, according to the photoelectrochemical cells including the photocathode structures according to Comparative example 1-1 and Comparative example 1-2, it was found that as the thickness of the protective layer increases, an overvoltage applied to the photoelectrochemical cell is increased. In detail, it was found that an overvoltage of approximately 1.2 V is further applied to the photoelectrochemical cell including the photocathode structure according to Comparative example 1-1 in order to provide a current density of 30 mA/cm$^2$ as compared with the photoelectrochemical cell including the photocathode structure according to Comparative Example 1-2. In other words, as described above with reference to FIG. 3, according to the photocathode structures according to Comparative example 1-1 and Comparative example 1-2, the second intermediate layer and the protective layer may form a triangular barrier. Accordingly, it was found that an overvoltage is applied to the driving of the photoelectrochemical cell including the photocathode structure.

Meanwhile, as described above with reference to FIG. 4, according to the photocathode structures according to Experimental example 2-1 and Experimental example 2-2, the first intermediate layer may substantially and selectively form a barrier. Accordingly, it was found that the photoelectrochemical cells including the photocathode structures according to Experimental example 2-1 and Experimental example 2-2 exhibit substantially the same cell characteristics regardless of the thickness of the protective layer.

In addition, it was found that the photoelectrochemical cells including the photocathode structures according to Experimental example 2-1 and Experimental example 2-2 exhibit improved cell characteristics as compared with the photoelectrochemical cell including the photocathode structure according to Experimental example 1.

Referring to FIG. 10, it was found that cell characteristics of the photoelectrochemical cell including the intermediate layer prepared by the hot water treatment are higher than cell characteristics of the photoelectrochemical cell including the intermediate layer prepared by rapid thermal oxidation (RTO) (i.e., Comparative example 2).

In addition, when the photoelectrochemical cell includes the intermediate layer prepared by the hot water treatment, it was found that as a time required for the hot water treatment is shortened within a range of 10 to 30 minutes, the cell characteristics of the photoelectrochemical cell become higher.

Figure 11:
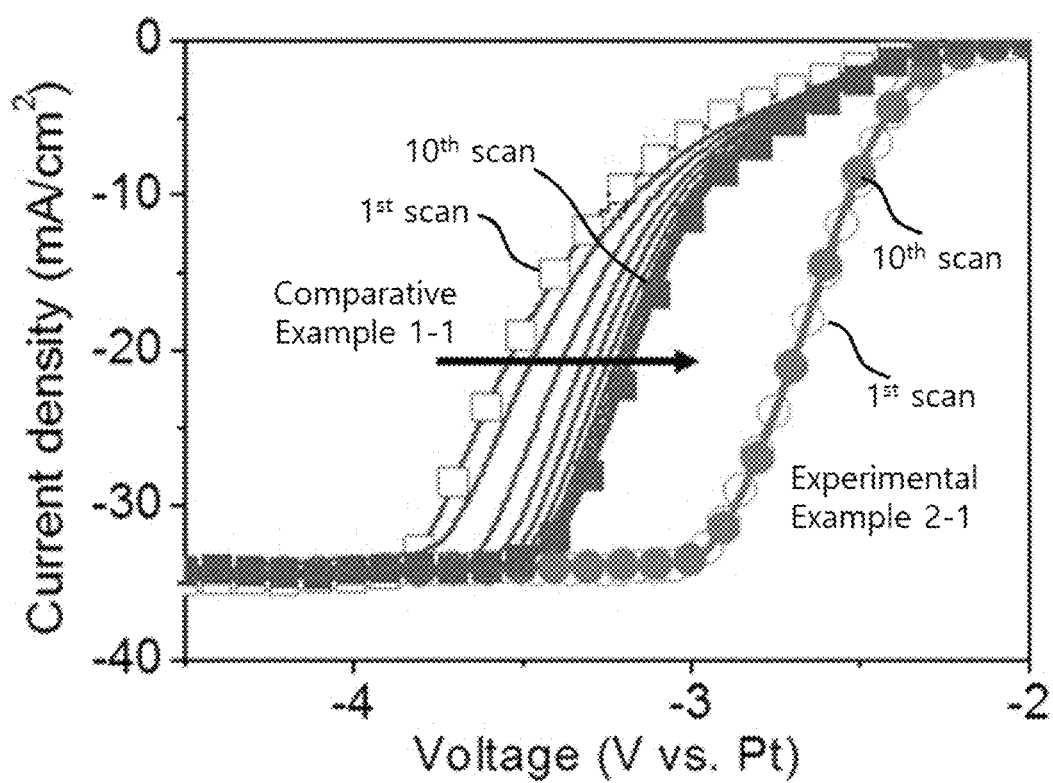
FIG. 11 is a view showing cell characteristics according to a cycle of the photoelectrochemical cell including the photocathode structure according to the embodiment of the present invention.

FIG. 11 is a view showing cell characteristics according to a cycle of the photoelectrochemical cell including the photocathode structure according to the embodiment of the present invention.

Referring to FIG. 11, cell characteristics according to cycles of the photoelectrochemical cells including the photocathode structures according to Comparative example 1- and Experimental example 2-1 of the present invention were observed.

As shown in FIG. 11, it was found that the photoelectrochemical cell including the photocathode structure according to Experimental example 2-1 of the present invention has substantially the same cell characteristics within a range of 1 to 10 cycles.

Meanwhile, it was found that as a number of cycles increases within the range of 1 to 10 cycles, the cell characteristics of the photoelectrochemical cell including the photocathode structure according to Comparative example 1-1 are improved. In other words, a silicon hafnium oxide thin film of the photocathode structure according to Comparative example 1-1 may have a higher defect density than the silicon oxide of the photocathode structure according to Experimental example 2-1. Accordingly, it was found that as the number of cycles of the photoelectrochemical cell including the photocathode structure according to Comparative example 1-1 increases, the defect in the silicon hafnium oxide is removed so that the cell characteristics of the photoelectrochemical cell are improved.

Figure 12:
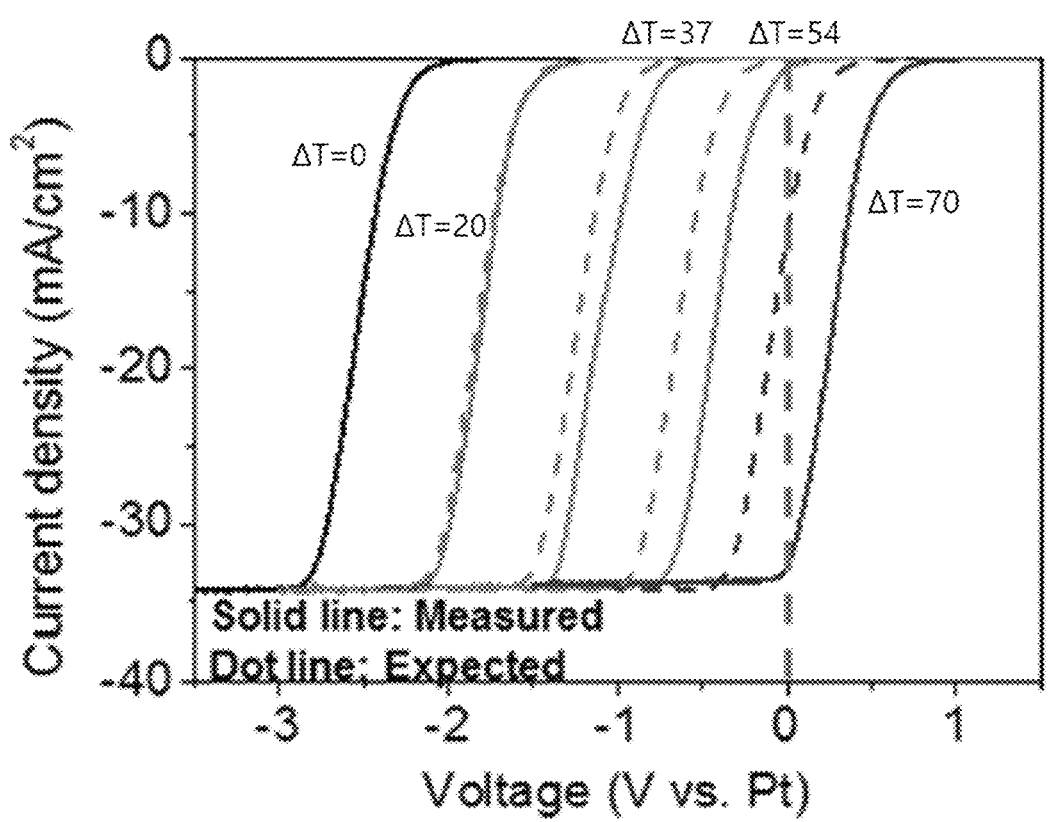
FIG. 12 is a view showing a current density versus a voltage based on linear sweep voltammetry (LSV) according to a temperature difference provided to the photoelectrochemical cell including the photocathode structure according to the embodiment of the present invention.
Figure 13:
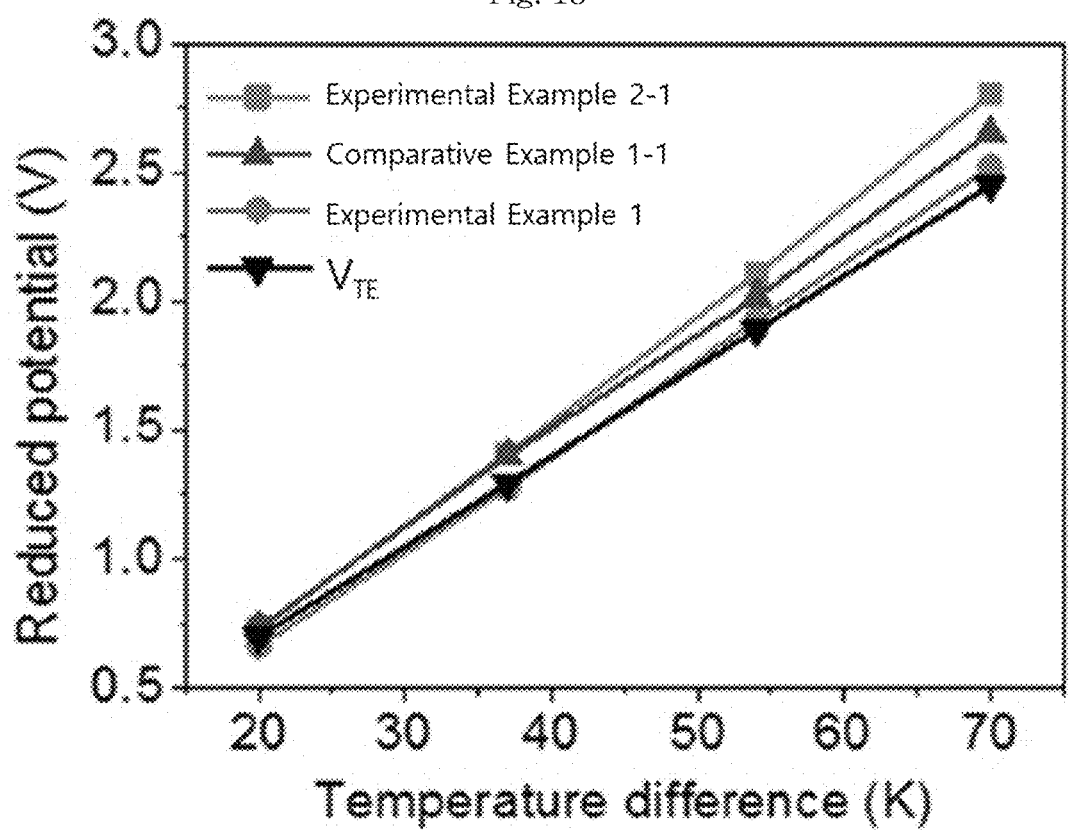
FIG. 13 is a view showing a reduced potential versus a temperature difference applied to the photoelectrochemical cell including the photocathode structure according to the embodiment of the present invention.

FIG. 12 is a view showing a current density versus a voltage based on linear sweep voltammetry (LSV) according to a temperature difference provided to the photoelectrochemical cell including the photocathode structure according to the embodiment of the present invention, and FIG. 13 is a view showing a reduced potential versus a temperature difference applied to the photoelectrochemical cell including the photocathode structure according to the embodiment of the present invention.

Referring to FIG. 12, for a hybrid electric generating element in which the photoelectrochemical cell including the photocathode structure according to Experimental example 2-1 of the present invention and a thermoelectric element are connected in series with each other, the cell characteristics of the photoelectrochemical cell according to a temperature difference of the thermoelectric element were observed.

As shown in FIG. 12, according to the photoelectrochemical cell, it was found that as a temperature difference ($\Delta T$) of the thermoelectric element increases, an overvoltage applied to drive the photoelectrochemical cell is reduced in proportion to a thermal gradient ($V_{TE}$) provided to the photoelectrochemical cell. In particular, it was found that the photoelectrochemical cell is driven by the temperature difference provided by the thermoelectric element substantially without the electric field applied from the outside while the temperature difference exceeds 54° C.

In this case, it was found that as the temperature difference of the thermoelectric element increases, a difference between cell characteristics of the photoelectrochemical cell expected by the temperature difference and measured cell characteristics of the photoelectrochemical cell is increased. In other words, it was found that as the temperature difference of the thermoelectric element increases, a value of the thermal gradient provided to the photoelectrochemical cell is substantially increased. In detail, when the temperature difference of the thermoelectric element is 70° C., it was found that a difference between an expected value and a measured value at a current density of 30 mA/cm² is 350 mV.

Accordingly, referring to FIG. 13, values of the thermal gradient versus the temperature difference applied to the photoelectrochemical cells including the photocathode structures according to Experimental example 1, Comparative example 1-1, and Experimental example 2-1 of the present invention may be observed.

In this case, the temperature difference and the thermal gradient may be represented by Formula 3 as follows.

$V_{TE}=S\Delta T$           <Formula 3>

In this case, S denotes a Seebeck coefficient. In other words, due to the temperature difference provided to the photoelectrochemical cell, the thermal gradient applied to the photoelectrochemical cell may be substantially expressed as a product of the temperature difference and the Seebeck constant of the photoelectrochemical cell.

Accordingly, as shown in FIG. 13, it was found that the photoelectrochemical cell including the photocathode structure according to Experimental example 2-1 has a greatest Seebeck constant of 41 mV/K.

In other words, as described above with reference to FIGS. 1 to 4, the photocathode structures according to Experimental example 1, Comparative example 1, and Experimental example 2-1 may include the barriers having mutually different thicknesses. Accordingly, it was found that the photocathode structures according to Experimental example 1, Comparative example 1, and Experimental example 2-1 have mutually different Seebeck constants.

As described above with reference to FIGS. 1 to 4, the electric field applied to the photocathode structure according to the embodiment of the present invention may be mainly provided to the intermediate layer. Accordingly, in order to observe the cell characteristics of the photoelectrochemical cell including the photocathode structure according to a thickness of the intermediate layer, photocathode structures according to Experimental example 3-1 to Experimental example 3-4 were fabricated by the same method as the photocathode structure according to Experimental example 2-1 described above while varying the thickness of the intermediate layer as shown in Table 2 below.

TABLE 2

| | Thickness of Intermediate Layer (nm) |
|---|---|
| Experimental example 3-1 | 1.4 |
| Experimental example 3-2 | 1.6 |
| Experimental example 3-3 | 1.8 |
| Experimental example 3-4 | 2.4 |

Figure 14:
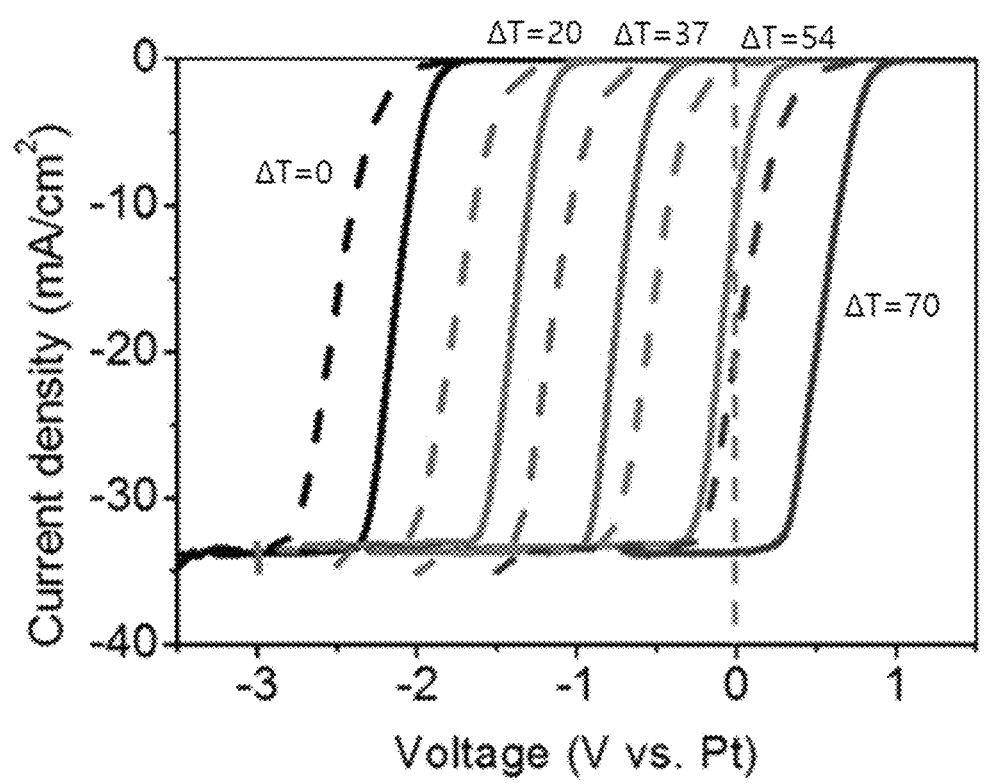
FIGS. 14 and 15 are views showing a reduced potential according to an applied temperature difference based on a thickness of an intermediate layer in the photoelectrochemical cell including the photocathode structure according to the embodiment of the present invention.
Figure 15:
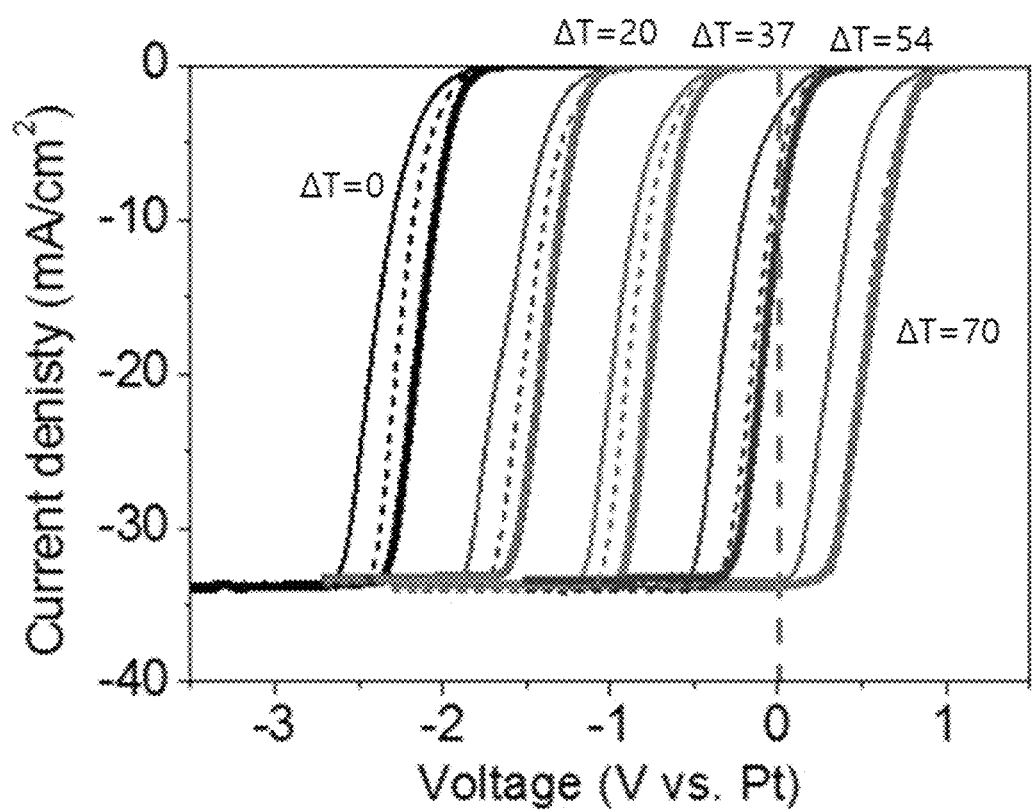

FIGS. 14 and 15 are views showing a reduced potential according to an applied temperature difference based on a thickness of an intermediate layer in the photoelectrochemical cell including the photocathode structure according to the embodiment of the present invention.

Referring to FIGS. 14 and 15, cell characteristics according to the thickness of the intermediate layer of the photoelectrochemical cells including the photocathode structures according to Experimental example 3-1 to Experimental example 3-4 of the present invention were observed.

Referring to FIGS. 14 and 15, it was found that as the thickness of the intermediate layer increases, an overvoltage applied to the photoelectrochemical cell is increased. Meanwhile, as shown in FIG. 15, when the thickness of the intermediate layer is less than or equal to 1.6 nm, it was found that the cell characteristics of the photoelectrochemical cell are substantially the same.

In addition, it was found that the photoelectrochemical cell spontaneously operates while the temperature difference applied to the photoelectrochemical cell exceeds 54° C.

Therefore, it was found that the photoelectrochemical cell spontaneously operates while the temperature difference applied to the photoelectrochemical cell exceeds 54 t and the thickness of the intermediate layer is less than or equal to 1.6 nm.

In addition, as can be understood from FIG. 9, it was found that even when the thickness of the protective layer (e.g., the hafnium oxide) varies (9 nm and 5 nm), the thickness of the protective layer does not substantially affect an actual operation of the element. Meanwhile, as can be understood from FIGS. 14 and 15, it was found that even when the thickness of the intermediate layer (e.g., the silicon oxide) slightly varies (varies in a unit of 0.2 nm), the thickness of the intermediate layer has a great influence on the reduction of overvoltage. In other words, it was found that an efficient way to reduce the overvoltage is to control the thickness of the intermediate layer (e.g., the silicon oxide) rather than to control the thickness of the protective layer (e.g., the hafnium oxide). In particular, as shown in FIGS. 12, 14, and 15, when an amount of a transmitted power varies according to the temperature difference (20° C., 37° C., 54° C., and 70° C.), if the thickness of the intermediate layer is controlled according to the amount of the power transmitted from the outside, a self-operated photoelectrochemical cell may be easily implemented.

Figure 16:
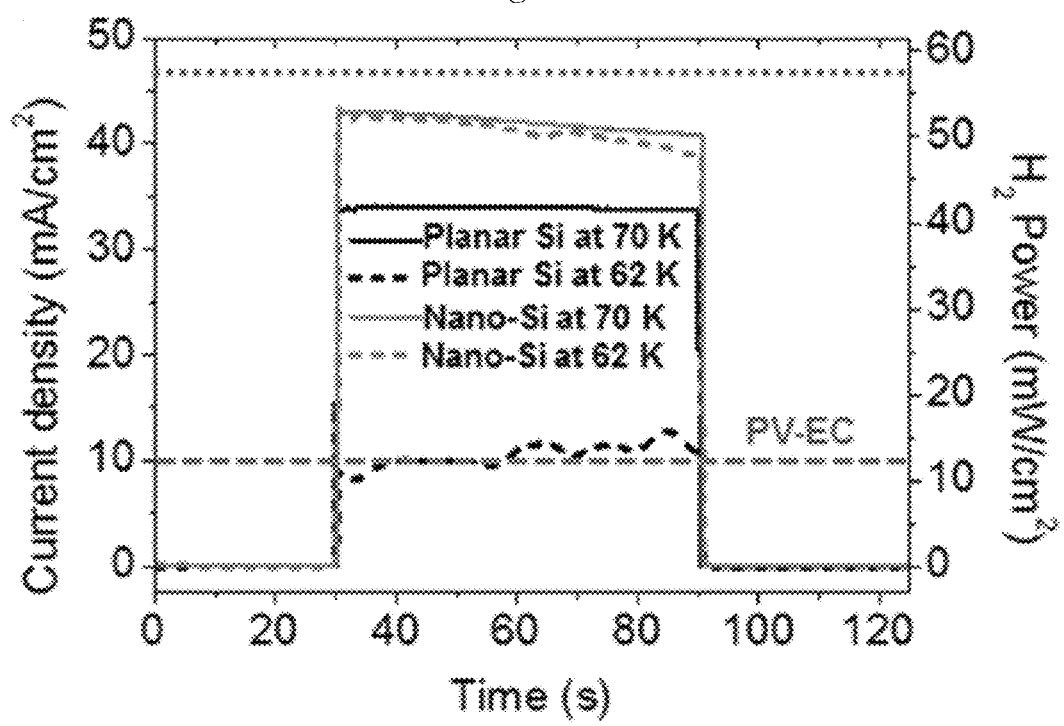
FIG. 16 is a view showing a current density and hydrogen power generation according to a surface shape and an applied temperature difference of the photoelectrochemical cell including the photocathode structure according to the embodiment of the present invention.

FIG. 16 is a view showing a current density and hydrogen power generation according to a surface shape and an applied temperature difference of the photoelectrochemical cell including the photocathode structure according to the embodiment of the present invention, and FIG. 17 is view showing a scanning electron microscope (SEM) image of a section of the photocathode structure according to the embodiment of the present invention, and a graph obtained by measuring a light absorption rate of a photocathode structure having a protrusion.

Referring to FIG. 16, cell characteristics according to a shape of the protective layer of the photoelectrochemical cell including the photocathode structure according to Experimental example 2-1 of the present invention were observed.

As shown in FIG. 17, the protective layer prepared as described above with reference to FIGS. 1 to 4 may be formed on a surface thereof with a protrusion, so that incident light that is incident on the photoelectrochemical cell may be prevented from being reflected, so that a light absorption rate may be improved (FIG. 17(b)). Therefore, as shown in FIG. 16, it was found that the photoelectrochemical cell including the photocathode structure having the protrusion according to Experimental example 2-1 of the present invention has a current density of approximately 42 mA/cm$^2$, and a hydrogen power of approximately 55 mW/cm$^2$ is generated. In addition, it was found that the cell characteristics are rarely changed by the temperature difference.

On the contrary, when the protective layer does not include a protrusion on the surface thereof, it was found that the current density (approximately 35 mA/cm$^2$) and the hydrogen power (approximately 42 mW/cm$^2$) of the photoelectrochemical cell may be reduced, and the cell characteristics of the photoelectrochemical cell are significantly changed by the applied temperature difference.

In conclusion, it was found that an efficient way to implement a photoelectrochemical cell, which has high reliability and high efficiency and is less affected from a surrounding environment, is to fabricate the photocathode structure having the protrusion.

Figure 18:
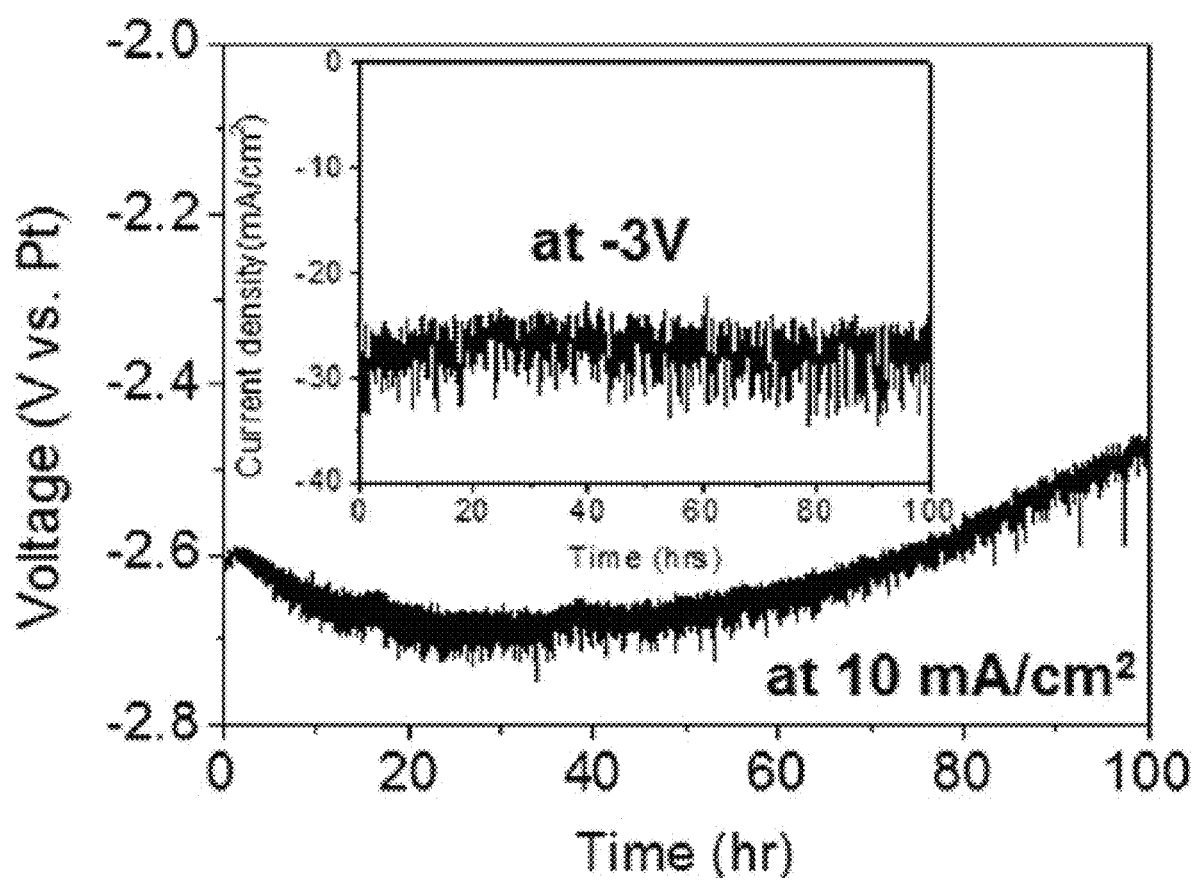
FIG. 18 is a view showing cell characteristics before and after stabilization of the photoelectrochemical cell including the photocathode structure according to the embodiment of the present invention.
Figure 19:
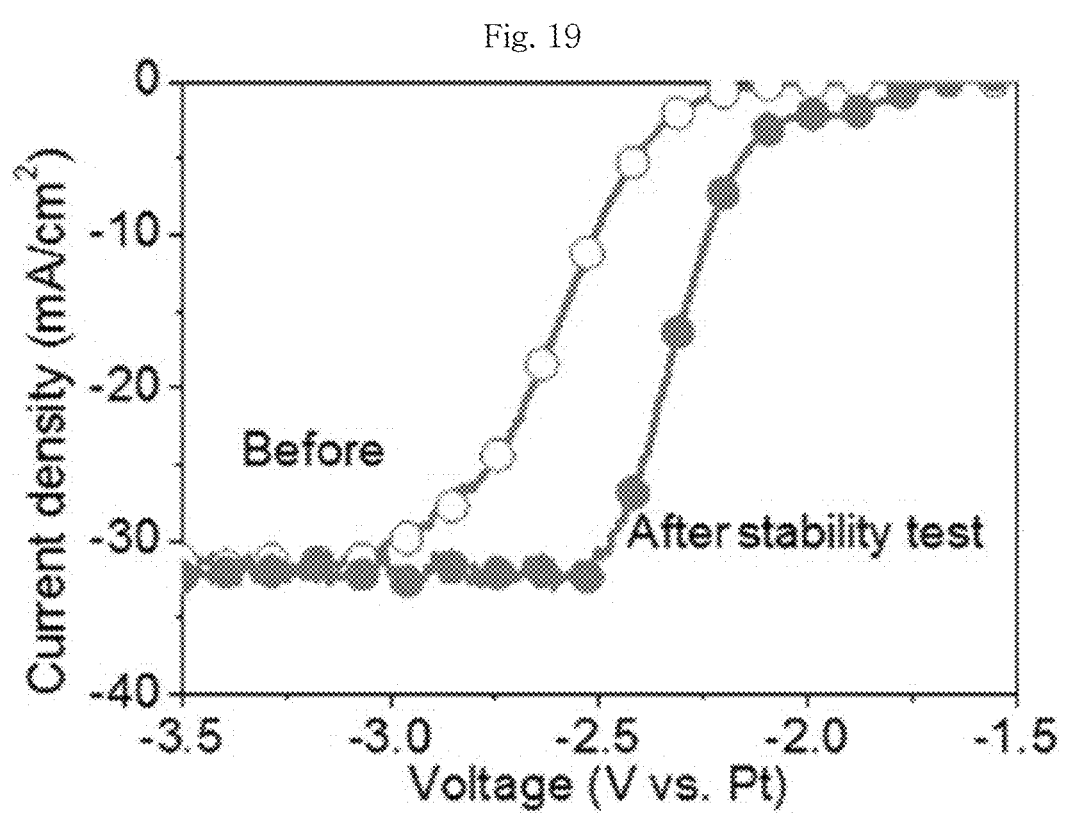
FIG. 19 is a view showing a current density versus a voltage based on linear sweep voltammetry (LSV) before and after stabilization of the photocathode structure according to the embodiment of the present invention.
Figure 21:
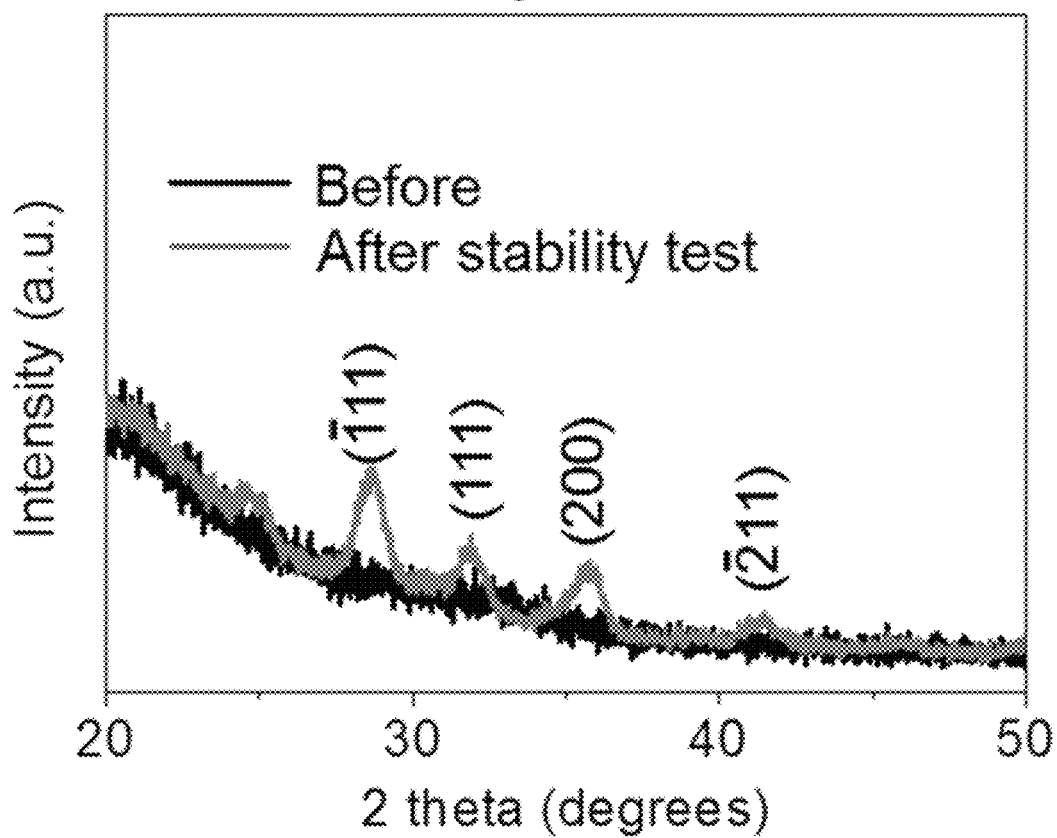
FIG. 21 is an X-ray diffraction (XRD) graph before and after the stabilization of the photocathode structure according to the embodiment of the present invention.

FIG. 18 is a view showing cell characteristics before and after stabilization of the photoelectrochemical cell including the photocathode structure according to the embodiment of the present invention, FIG. 19 is a view showing a current density versus a voltage based on linear sweep voltammetry (LSV) before and after stabilization of the photocathode structure according to the embodiment of the present invention, FIG. 20 is a view obtained by capturing a transmission electron microscope (TEM) image of a protective layer before and after the stabilization of the photocathode structure according to the embodiment of the present invention, and FIG. 21 is an X-ray diffraction (XRD) graph before and after the stabilization of the photocathode structure according to the embodiment of the present invention.

Referring to FIGS. 18 and 19, as described above with reference to FIGS. 1 to 4, the protective layer of the photocathode structure according to Experimental example 2-1 of the present invention may be in the amorphous state. Accordingly, the protective layer may have a defect, so that charges transferred from the p-type silicon substrate may be trapped in the defect of the protective layer.

However, stabilization was performed by continuously providing a voltage of −3 V to the photoelectrochemical cell including the photocathode structure. Accordingly, as shown in FIG. 18, it was found that the cell characteristics of the photoelectrochemical cell are improved.

Referring to FIGS. 20 and 21, as described above with reference to FIGS. 1 to 4, it was found that the protective layer is in the amorphous state (FIG. 20(a)). Meanwhile, it was found that as a stability test of the photoelectrochemical cell is performed, the protective layer is crystallized (FIG. 20(b)).

Therefore, it was found that as the protective layer is crystallized, the cell characteristics of the photoelectrochemical cell are improved.

In detail, it was found that the photoelectrochemical cell has long-term stability of 200 hours or more by the stability test.

TABLE 3

| Protective Layer | Electrolyte | Stability (hr) | Photocurrent (mA/cm$^2$) |
|---|---|---|---|
| HfO$_x$ (Experimental example 2-1) | 0.5M H$_2$SO$_4$ | 200 | 33 |
| TiO$_x$ | 0.5M H$_2$SO$_4$ | 960 | 20.5 |
| TiO$_x$ | 1M KOH | 80 | 32.5 |
| AlO$_x$ | 0.5M H$_2$SO$_4$ | 12 | 28 |
| MoS$_2$ | 0.5M H$_2$SO$_4$ | 24 | 32 |
| SrTiO$_3$ | 0.5M H$_2$SO$_4$ | 35 | 31 |
| Ta$_2$O$_5$ | 0.5M H$_2$SO$_4$ | 200 | 31 |

As can be understood from Table 3, it was found that the photoelectrochemical cell including the photocathode structure according to Experimental example 2-1 of the present invention has long-term stability at a relatively high photocurrent.

Although the exemplary embodiments of the present disclosure have been described in detail, the scope of the present disclosure is not limited to a specific embodiment, and should be interpreted by the appended claims. In addition, it should be understood by those of ordinary skill in the art that various changes and modifications can be made without departing from the scope of the present disclosure.

What is claimed is:

1. A hybrid electric generating element comprising:
   a photoelectrochemical cell including a photocathode structure; and
   a thermoelectric element connected in series with the photoelectrochemical cell,
   wherein the photocathode structure comprises:
      a photocathode including silicon (Si);
      an intermediate layer disposed on the photocathode, the intermediate layer including silicon oxide having a thickness between 1.4 nm and 1.6 nm; and
      a protective layer disposed on the intermediate layer, and including a metal oxide,
   wherein the intermediate layer is a tunneling barrier configured to transfer charges from the photocathode to the protective layer by an electric field applied from an outside, and
   wherein when a temperature difference applied to the thermoelectric element exceeds 54° C., a water-splitting reaction of the photoelectrochemical cell is spontaneously performed.

2. The hybrid electric generating element of claim 1, wherein
    the silicon oxide has a first dielectric constant, and
    the metal oxide has a second dielectric constant that is higher than the first dielectric constant.

3. The hybrid electric generating element of claim 1, wherein the protective layer is changed from an amorphous state to a crystalline state by the electric field applied from the outside.

4. The hybrid electric generating element of claim 1, wherein the metal oxide includes at least one of a hafnium oxide, a zirconium oxide, a tantalum oxide, a titanium oxide, an aluminum oxide, or a strontium titanate.

5. The hybrid electric generating element of claim 1, wherein a surface of the protective layer includes a plurality of protrusions.

6. The hybrid electric generating element of claim 5, wherein the photoelectrochemical cell is stabilized by providing a —3 V voltage to the photoelectrochemical cell, including the photocathode structure, thereby crystallizing the protective layer.

7. The hybrid electric generating element of claim 5, wherein a thickness of the intermediate layer of the photocathode structure is controlled according to a power that is suppliable from the thermoelectric element to the photoelectrochemical cell.

* * * * *

UNITED STATES PATENT AND TRADEMARK OFFICE
CERTIFICATE OF CORRECTION

PATENT NO. : 11,643,737 B2
APPLICATION NO. : 17/346325
DATED : May 9, 2023
INVENTOR(S) : Jung-Ho Lee et al.

It is certified that error appears in the above-identified patent and that said Letters Patent is hereby corrected as shown below:

On the Title Page

Item (57) "ABSTRACT", in Line 4:
Please replace "layer foiled on" with --layer formed on--.

Signed and Sealed this
Sixth Day of June, 2023

Katherine Kelly Vidal
*Director of the United States Patent and Trademark Office*